(12) United States Patent
Geen et al.

(10) Patent No.: US 9,878,901 B2
(45) Date of Patent: Jan. 30, 2018

(54) FABRICATION OF TUNGSTEN MEMS STRUCTURES

(71) Applicant: Analog Devices, Inc., Norwood, MA (US)

(72) Inventors: John A. Geen, Tewksbury, MA (US); George M. Molnar, Westford, MA (US); Gregory S. Davis, Woburn, MA (US); Bruce Ma, Methuen, MA (US); Kenneth J. Cole, Somerville, MA (US); James Timony, North Andover, MA (US); Kenneth Flanders, Reading, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/670,829

(22) Filed: Mar. 27, 2015

(65) Prior Publication Data

US 2015/0336790 A1    Nov. 26, 2015

Related U.S. Application Data

(60) Provisional application No. 61/975,061, filed on Apr. 4, 2014.

(51) Int. Cl.
*H01L 29/84* (2006.01)
*B81B 3/00* (2006.01)
(Continued)

(52) U.S. Cl.
CPC ........ *B81B 3/0072* (2013.01); *B81C 1/00325* (2013.01); *B81C 1/00492* (2013.01);
(Continued)

(58) Field of Classification Search
CPC .................. B81B 3/0072; B81C 1/00325
See application file for complete search history.

(56) References Cited

U.S. PATENT DOCUMENTS

| 5,205,171 A | 4/1993 | O'Brien et al. ............ 73/517 B |
| 5,314,572 A | 5/1994 | Core et al. .................... 156/643 |

(Continued)

FOREIGN PATENT DOCUMENTS

| CN | 1331352 A | 1/2002 | ............. C22C 29/08 |
| CN | 102372250 A | 3/2012 | ............... B81C 1/00 |

(Continued)

OTHER PUBLICATIONS

Korean Intellectual Property Office, In Korean: Office Action—Notice of Preliminary Rejection pertaining to Korean Patent Application No. 10-2015-0047611 dated May 10, 2016, 5 pages.

(Continued)

*Primary Examiner* — Marc Armand
*Assistant Examiner* — Sarah Salerno
(74) *Attorney, Agent, or Firm* — Wolf, Greenfield & Sacks, P.C.

(57) ABSTRACT

Thick (i.e., greater than two microns), fine-grained, low-stress tungsten MEMS structures are fabricated at low temperatures, particularly for so-called "MEMS last" fabrication processes (e.g., when MEMS structures are fabricated after electronic circuitry is fabricated). Means for very accurately etching structural details from the deposited tungsten layer and for strongly and stably anchoring the tungsten layer to an underlying substrate are disclosed. Also, means for removing a sacrificial layer underlying the mobile tungsten layer without damaging the tungsten or allowing it to be drawn down and stuck by surface tension is disclosed.

19 Claims, 16 Drawing Sheets

(51) Int. Cl.
*B81C 1/00* (2006.01)
*G01C 19/5628* (2012.01)
*G01P 15/08* (2006.01)
*H04R 19/00* (2006.01)

(52) U.S. Cl.
CPC ...... *G01C 19/5628* (2013.01); *G01P 15/0802* (2013.01); *B81B 2203/0118* (2013.01); *B81B 2203/0307* (2013.01); *H04R 19/005* (2013.01)

(56) References Cited

U.S. PATENT DOCUMENTS

| | | | |
|---|---|---|---|
| 5,417,111 | A | 5/1995 | Sherman et al. ........... 73/517 R |
| 5,501,893 | A | 3/1996 | Laermer et al. ............. 428/161 |
| 5,798,283 | A * | 8/1998 | Montague .......... B81C 1/00246 438/200 |
| 6,122,961 | A | 9/2000 | Geen et al. ................ 73/504.12 |
| 6,137,150 | A | 10/2000 | Takeuchi et al. ............. 257/417 |
| 6,204,200 | B1 | 3/2001 | Shieh et al. .................. 438/778 |
| 6,511,551 | B2 | 1/2003 | Kim et al. ..................... 148/237 |
| 7,160,752 | B2 | 1/2007 | Ouellet et al. .................. 438/52 |
| 7,367,232 | B2 | 5/2008 | Vaganov et al. .......... 73/514.33 |
| 8,486,198 | B2 | 7/2013 | Appleyard et al. ............... 134/1 |
| 8,631,702 | B2 | 1/2014 | Horning et al. ........... 73/504.13 |
| 2006/0027020 | A1* | 2/2006 | Ocansey .............. B81B 3/0005 73/514.01 |
| 2007/0238213 | A1 | 10/2007 | Yamaguchi et al. ............ 438/48 |
| 2009/0095713 | A1* | 4/2009 | Dimeo, Jr. ............. C23C 14/564 216/58 |
| 2010/0249804 | A1* | 9/2010 | Huitema ................ A61B 17/10 606/143 |
| 2011/0005319 | A1 | 1/2011 | Huang ....................... 73/514.32 |
| 2011/0066623 | A1 | 4/2011 | Crickmore et al. ............ 367/13 |
| 2012/0137773 | A1 | 6/2012 | Judy et al. ................. 73/504.12 |
| 2012/0248615 | A1 | 10/2012 | Chien et al. ................... 257/770 |
| 2012/0249804 | A1 | 10/2012 | Suzuki et al. |
| 2012/0279838 | A1 | 11/2012 | Lai et al. ...................... 200/181 |
| 2013/0344280 | A1 | 12/2013 | Boomhour ................... 428/76 |
| 2014/0068931 | A1 | 3/2014 | Horning et al. ................ 29/825 |
| 2014/0262835 | A1* | 9/2014 | Hunter ................. G01N 27/417 205/785.5 |

FOREIGN PATENT DOCUMENTS

| | | | |
|---|---|---|---|
| DE | 602004010729 T2 | 12/2008 | ............... B81B 7/00 |
| JP | H08-125199 | 5/1996 | ............. H01L 29/84 |
| JP | 2008-221450 | 9/2008 | ............... B81C 1/00 |
| JP | 2012-42452 | 3/2012 | ......... G01C 19/5691 |
| JP | 2013-219303 | 10/2013 | ............. H01L 29/84 |
| KR | 10 2005 0055330 A | 6/2005 | |
| KR | 10 2006 0092245 A | 8/2006 | |
| KR | 10 2007 0019719 A | 2/2007 | |
| KR | 101408904 B1 | 6/2014 | |

OTHER PUBLICATIONS

Korean Intellectual Property Office, English Translation: Office Action—Notice of Preliminary Rejection pertaining to Korean Patent Application No. 10-2015-0047611 dated May 10, 2016, 3 pages.
Japanese Patent Office, Office Action: Notice of Reasons for Rejection—Japanese patent Application No. 2015-068743, dated Mar. 11, 2016, 2 pages.
Japanese Patent Office (English translation), Office Action: Notice of Reasons for Rejection—Japanese patent Application No. 2015-068743, dated Mar. 11, 2016, 3 pages.
Raffo et al., Grain Growth in Dilute Tungsten-Boron Alloys, NASA Technical Note D-2649, 25 pages, Mar. 1965.
Enxi et al., "Effect of Inhibitor on Ultrafine Grained Cemented Carbides", Cemented Carbide, vol. 19, Issue 3, 2002, 8 pages (in Chinese).
Chinese Patent Office, Office Action: Chinese Application No. 20151058150.X, dated Apr. 5, 2016, 14 pages (in Chinese).
Kim & Chang Intellectual Property, Amendment to Application—Korean Application No. 10-2015-0047611, dated Jul. 11, 2016, 7 pages (in Korean).
Kim & Chang Intellectual Property, Response to Office Action—Korean Application No. 10-2015-0047611, dated Jul. 11, 2016, 11 pages (in Korean).
CCPIT Patent and Trademark Law Office, Response to Office Action: Chinese Application No. 20151058150.X, filed Aug. 22, 2016, 9 pages (in Chinese).
Japanese Patent Office, Office Action: Notice of Reasons for Rejection—Japanese Patent Application No. 2015-068743, dated Aug. 30, 2016, 3 pages.
Japanese Patent Office (English translation), Office Action: Notice of Reasons for Rejection—Japanese Patent Application No. 2015-068743, dated Aug. 30, 2016, 5 pages.
Chinese Patent Office, Response to Office Action: Chinese Application No. 20151058150.X, dated Nov. 21, 2016, 10 pages (in Chinese).
CCPIT Patent and Trademark Law Office, Pending Amended Claims after Telephone Examiner Interview—Chinese Application No. 201501158150.X, dated Nov. 18, 2016, 4 pages (in English).
German Patent Office, Office Action: German Application No. 10 2015 104 913.9, dated Dec. 14, 2016, 7 pages.
German Patent Office (English Translation), Office Action: German Application No. 10 2015 104 913.9, dated Dec. 14, 2016, 7 pages.
Chinese Patent Office, Office Action: Chinese Application No. 201510158150.X, dated Dec. 2, 2016, 3 pages.
Korean Intellectual Property Office, Office Action: Korean Application No. 10-2015-0047611, dated Nov. 29, 2016, 5 pages.
Korean Intellectual Property Office (English Translation), Office Action: Korean Application No. 10-2015-0047611, dated Nov. 29, 2016, 6 pages.

* cited by examiner

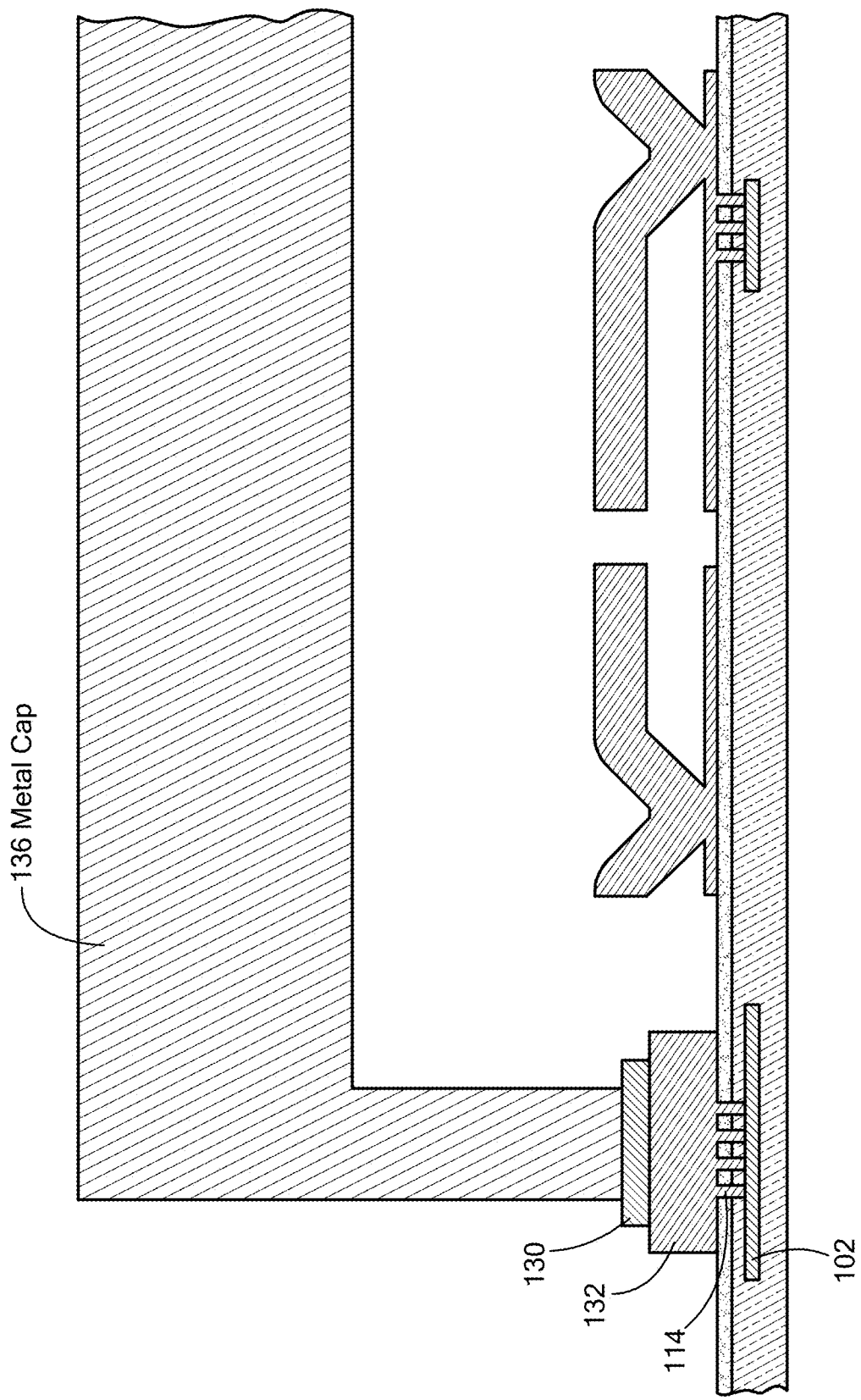

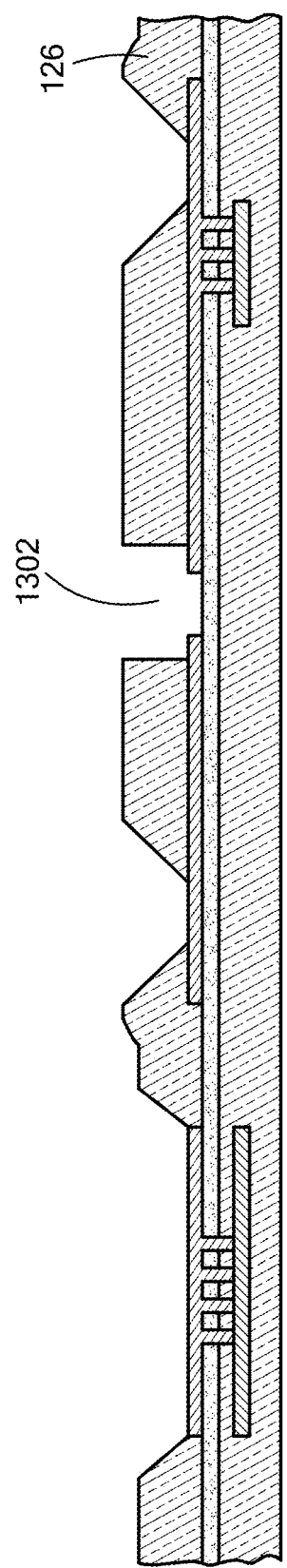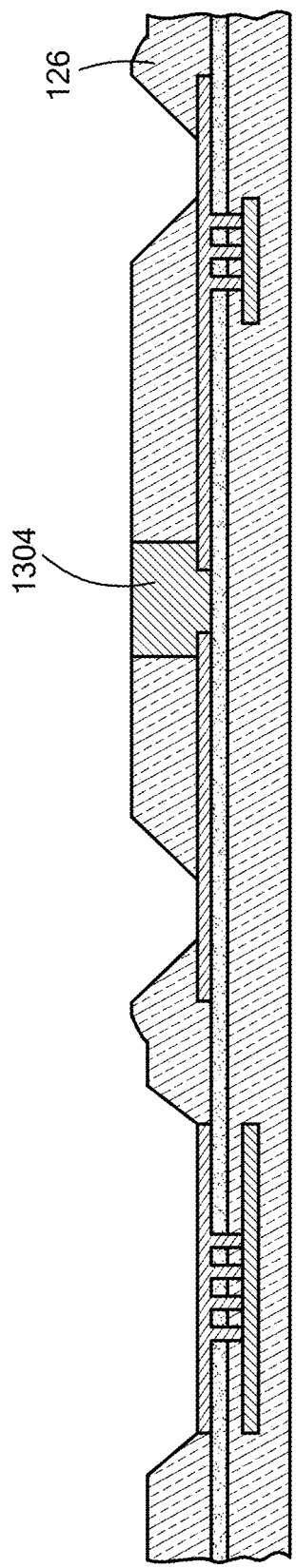

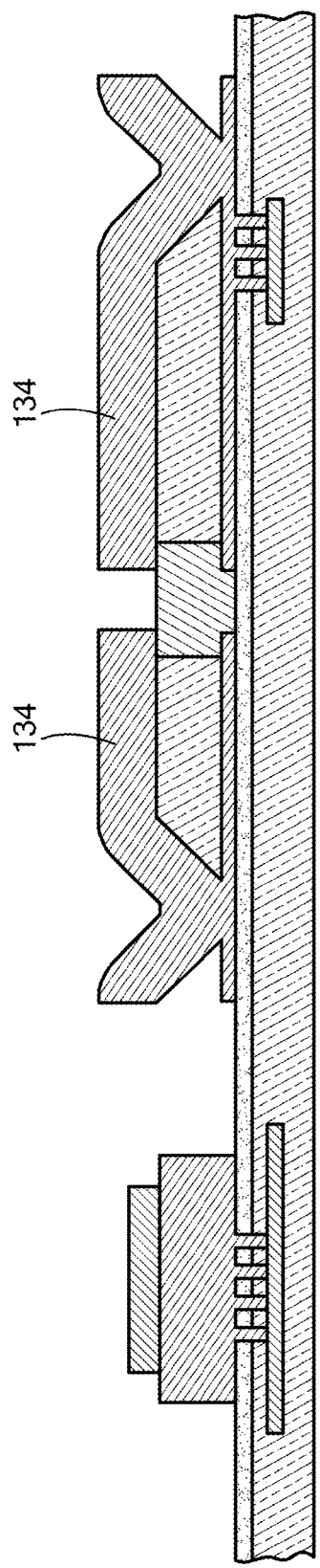
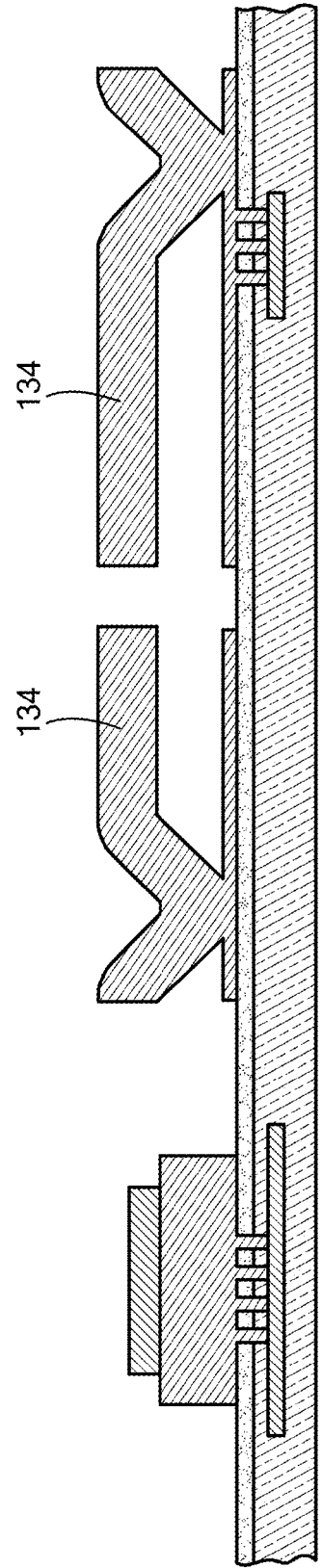
FIG. 17
FIG. 18

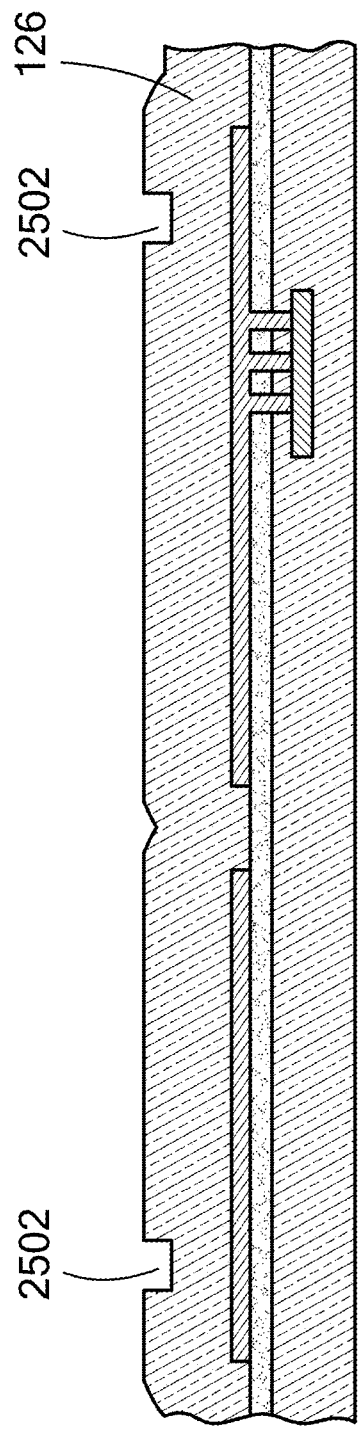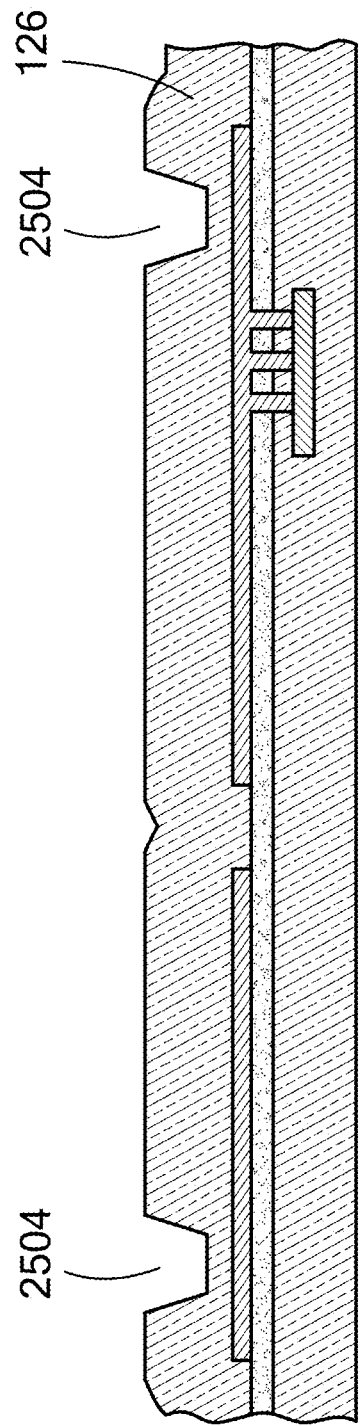

FABRICATION OF TUNGSTEN MEMS STRUCTURES

CROSS-REFERENCE TO RELATED APPLICATION(S)

This patent application claims the benefit of, and therefor claims priority to, U.S. provisional patent application no. 61/975,061 entitled FABRICATION OF TUNGSTEN MEMS STRUCTURES filed on Apr. 4, 2014, which is hereby incorporated herein by reference in its entirety.

FIELD OF THE INVENTION

The present invention relates generally to MEMS devices and, more particularly, relates to fabrication of tungsten MEMS structures.

BACKGROUND OF THE INVENTION

Microelectromechanical systems (MEMS) devices including such things as inertial sensors (e.g., capacitive, piezoelectric, and convective accelerometers and vibratory and tuning fork gyroscopes), microphones, pressure sensors, RF devices, and optical devices (e.g., optical switches) often include a number of structures that are released so as to be movable. Examples of released structures include microphone diaphragms, inertial sensor proof masses and shuttles, and suspended encapsulation layer(s) that cap sensor structures.

MEMS devices are typically formed on a substrate (e.g., a silicon or silicon-on-insulator wafer) using various micromachining techniques such as etching into the substrate and/or depositing/patterning various materials. Structures to be released are typically formed on top of one or more "sacrificial" layers of materials that are subsequently removed to release the structure. Typical sacrificial layers for MEMS wafer fabrication include an oxide layer. The oxide layer is typically removed using a wet or dry etch process. A wet etch process (e.g., buffered oxide etch) typically requires releasing holes that are carefully placed and spaced to allow for wet etch access, which can impose certain constraints on product design and processes. A dry etch process (e.g., vapor HF) generally provides more freedom in the placement and spacing of etch holes, which in turn can lead to more flexibility in the sensor design.

It has been recognized by the inventors for over a decade that tungsten has significant advantages over the silicon traditionally used as a material for manufacturing micromachined inertial instruments. In particular, if tungsten mechanical structures could be incorporated into electronics in a way similar to that taught by Sherman et al. in U.S. Pat. No. 5,417,111, then substantial improvements in the cost and accuracy could be made. The cost for a given performance could be reduced by reducing the mechanical structure size or the accuracy enhanced in a given size by exploiting the greater inertial signal from tungsten.

The reasons for this lie in the properties of tungsten metal. First, it is, like silicon, a brittle material at normal temperatures (i.e., in the sense of not being plastic). That is, it does not assume a permanent deformation when strained to an extent less than breaking. Thus it forms moving structures with stable geometry and stiffness. Second, it has a density 8.3 times that of silicon. So, a tungsten structure experiences about eight times the inertial force compared with a similar size silicon structure whereas they might be expected to get more nearly the same perturbing forces from non-inertial sources such as Brownian motion of the surrounding medium (or alternatively a tungsten structure can be approximately one-eighth the size of a silicon structure to experience the same inertial force, e.g., 4 um thickness of tungsten is approximately the same mass as 33 um thickness of silicon). Thus, one expects tungsten to yield much improved signal to noise ratio (SNR). Third, tungsten has 2.5 times greater Young's modulus than silicon. Greater structural stiffness can be obtained from a given size, making it less susceptible to perturbation. Fourth, our measurements indicate that the absolute strengths of tungsten microstructures are comparable with those of silicon. Strength is a critical parameter in designing moving structures. Fifth, unlike silicon, tungsten has electrically conductive oxides. Silicon naturally forms an insulating surface oxide which, to a varying extent over temperature, time and environmental factors, traps electrical charge. This destabilizes micromachined gyroscope and accelerometer null bias, generally the most important measure of inertial instrument accuracy. It has been found that coating active surfaces of silicon sensors with a conductor vastly improves their stability, as taught by O'Brien et al. in U.S. Pat. No. 5,205,171. Although it may, like silicon, adsorb foreign species on the surface, tungsten is free of the dominant charging effect.

Others have recognized the use of tungsten in MEMS devices would have certain advantages, particularly as a substitute for silicon. For example, U.S. Pat. No. 7,367,232 and U.S. Published Patent Application Nos. U.S. 2011/0005319 and U.S. 2011/0096623 mention tungsten as a possible material for various MEMS structures. However, the mere disclosure of tungsten as a possible material for MEMS structures does not actually disclose or enable the implementation of such tungsten MEMS structures in a usable manner. The inventors have experimented with tungsten MEMS structures (e.g., as a substitute for silicon structures) and have found that the use of traditional fabrication processes produces tungsten MEMS structures with high internal stresses such that the tungsten MEMS structures tend to warp or bend when released, resulting in devices that are unusable or of low performance.

SUMMARY OF EXEMPLARY EMBODIMENTS

In one embodiment of the present invention, a method for fabricating a MEMS device involves depositing a tungsten-based material at a temperature under around 500 C. and using a grain growth inhibitor to form a low-stress tungsten-based material layer at least two microns thick above an underlying oxide layer without first densifying the oxide layer. The method also involves etching the tungsten-based material layer to form a tungsten-based MEMS structure.

In various alternative embodiments, the tungsten-based MEMS structure may be a releasable tungsten-based movable mass, in which case the method may further involve removing oxide underlying the releasable tungsten-based movable mass to release the tungsten-based movable mass.

In various alternative embodiments, the MEMS device may include electronic circuitry prior to depositing the tungsten-based material, in which case depositing of the tungsten-based material may not raise the temperature of the electronic circuitry above around 450 C.

In various alternative embodiments, depositing the tungsten-based material layer may involve depositing the tungsten-based material on a target doped with a grain growth inhibitor such as boron or a rare-earth metal. Alternatively, depositing the tungsten-based material layer may involve alternately (1) depositing a tungsten-based material layer and (2) introducing a grain growth inhibitor such as boron or a rare-earth metal to stop vertical grain growth to a subsequently deposited tungsten-based material layer.

In further alternative embodiments, etching the tungsten-based material layer may involve etching the tungsten-based material layer using an etchant that is essentially fluorine generated from sulfur hexafluoride (SF6) gas and a passivating layer of polytetrafluoroethylene-like polymer is generated from trifluoromethane to form an accurate, strongly anisotropic etch. The residual protective polymer may be removed after etching using an oxygen-plasma. Depositing the tungsten-based material may involve controlling oxygen levels during the deposition of the tungsten-based material. Etching the tungsten-based material layer to form at least one releasable tungsten-based movable mass further may involve etching the tungsten-based material layer to form at least one electrode adjacent to the movable mass.

The method may further involve forming at least one tungsten-based anchor through the oxide layer to an underlying substrate prior to depositing the tungsten-based material to form the low-stress tungsten-based material layer, wherein the MEMS structure is anchored to the underlying substrate by the at least one tungsten-based anchor. In certain embodiments, the at least one tungsten-based anchor may be a composite anchor comprising a matrix of small tungsten-based anchors around 1 micron in diameter each, in which case forming the matrix of small tungsten-based anchors may involve patterning the oxide layer to form a patterned oxide layer including a matrix of small holes of around 1 micron in diameter each through the oxide layer to the underlying substrate and filling the holes with tungsten-based plugs to form the matrix of small tungsten-based anchors. Alternatively, the at least one tungsten-based anchor may be a large tungsten-based anchor, in which case forming the large tungsten-based anchor may involve patterning the oxide layer by etching a cavity in the oxide layer using a plurality of etching steps that incrementally increase the width and depth of the cavity such that the cavity extends through the oxide layer to the underlying substrate and is substantially wider at the top than at the bottom and filling the cavity uniformly with a tungsten-based material to form the large tungsten-based anchor. The underlying substrate may be a ground plane structure of the MEMS device, in which case the at least one tungsten-based anchor may be formed of substantially pure tungsten and the ground plane structure may be formed of titanium-tungsten. In any case, the at least one tungsten-based anchor may be filled uniformly without voids or cracks. The at least one tungsten-based anchor and the tungsten-based material layer may be formed of the same tungsten-based material.

In another embodiment of the present invention, a MEMS device comprises a low-stress tungsten-based MEMS structure at least two microns thick formed by the process depositing a tungsten-based material at a temperature under around 500 C. and using a grain growth inhibitor to form a low-stress tungsten-based material layer at least two microns thick above an underlying oxide layer without first densifying the oxide layer and etching the tungsten-based material layer to form a tungsten-based MEMS structure.

In various alternative embodiments, the MEMS structure may be anchored to the underlying substrate by at least one tungsten-based anchor that extends from the MEMS structure through the oxide layer to the underlying substrate. In certain embodiments, the at least one tungsten-based anchor may be a composite anchor comprising a matrix of small tungsten-based anchors around 1 micron in diameter each. In alternative embodiments, the at least one tungsten-based anchor may include a large tungsten-based anchor that is substantially wider at the top than at the bottom. The underlying substrate may be a ground plane structure of the MEMS device, in which case the at least one tungsten-based anchor may be formed of substantially pure tungsten and the ground plane structure may be formed of titanium-tungsten. The at least one tungsten-based anchor and the low-stress tungsten-based MEMS structure may be formed of the same tungsten-based material.

Additional embodiments may be disclosed and claimed.

BRIEF DESCRIPTION OF THE DRAWINGS

The foregoing features of embodiments will be more readily understood by reference to the following detailed description, taken with reference to the accompanying drawings, in which:

FIGS. 1-12 depict various fabrication process steps for an exemplary fabrication process that essentially replaces silicon-based MEMS structures and electrical interconnects with tungsten-based MEMS structures and electrical interconnects, in accordance with one exemplary embodiment;

FIGS. 13-18 depict various fabrication processes for use of a pedestal, in accordance with one exemplary embodiment;

FIGS. 25-28 depict various fabrication processes for formation of tungsten-based anchors for anchoring the releasable MEMS structures, in accordance with one specific exemplary embodiment.

DETAILED DESCRIPTION OF SPECIFIC EMBODIMENTS

Figure 1:
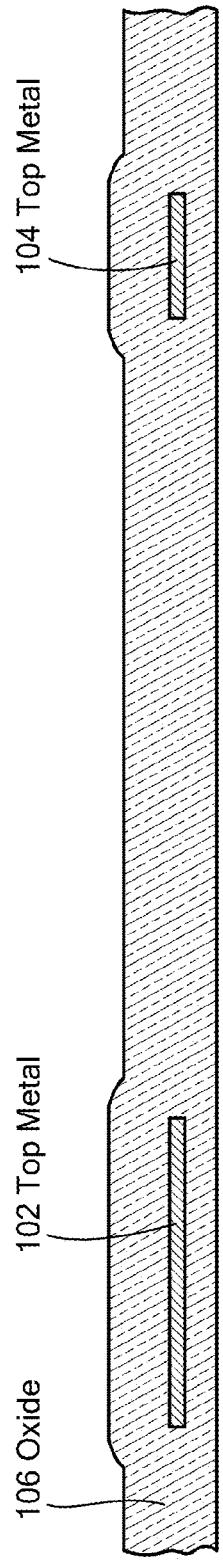

Definitions. As used in this description and the accompanying claims, the following terms shall have the meanings indicated, unless the context otherwise requires:

The term "tungsten-based" means a material that is substantially solid tungsten, optionally with a small amount of one or more substances included to control grain boundaries during a low-temperature (i.e., under around 500 C.) deposition process.

The term "movable" with respect to a mass of a MEMS device means a MEMS structure that is configured to move in a predetermined mode. In some types of MEMS devices, movement of the mass may be driven (e.g., a resonator in a MEMS gyroscope) while in other types of MEMS devices, movement of the mass may be passive (e.g., a proof mass in a MEMS accelerometer). Driven movement may be translational (e.g., dithered side-to-side), rotational (e.g., dithered back and forth about a central pivot point), bulk acoustic wave, or other driven mode.

As discussed above, it has been recognized that the use of tungsten in MEMS devices would have certain advantages, particularly as a substitute for silicon. The effect on the SNR of gyroscopes of the type in U.S. Pat. No. 6,122,961, when substituting tungsten for silicon, is estimated by the examples shown in Appendices A-B.

Fabrication of Tungsten Structures

Some considerations for fabrication of tungsten MEMS structures are now discussed.

First, the layer of tungsten needs to be intrinsically of very low stress and therefore needs to be fine-grained and needs to remain fine-grained in order to provide stable structural geometry, and particularly for so-called "MEMS last" fabrication processes (e.g., when MEMS structures are fabricated after electronic circuitry is fabricated), the deposition of the tungsten needs to be a low temperature process so that the underlying electronics circuits are not corrupted by heat. While annealing of tungsten can produce a low stress layer, the temperature required to anneal tungsten is beyond the melting point of the electronics.

Second, a means of strongly and stably anchoring the tungsten layer to the underlying substrate is needed or else the advantages of a strong, brittle material would be lost. That bond also should have a low, stable electrical contact resistance.

Third, a means of very accurately etching the structural details from the uniform deposit of tungsten is needed. Very accurate inertial instruments usually gain their stability by differential measurement techniques. In order to maintain strict differential measurements, the opposing parts of the structure must be accurately the same size and shape.

Fourth, a means for removing a sacrificial layer underlying the mobile tungsten layer without damaging the tungsten or allowing it to be drawn down and stuck by surface tension is needed.

In certain exemplary embodiments of the present invention, tungsten is deposited at low temperature without raising the temperature of the substrate material above around 450 C. (which is generally about the highest temperature that modern electronics can reach without damage, with smaller parts such as transistors generally more susceptible to damage), specifically by sputtering at a temperature under around 500 C. (e.g., between around 400 C. and 500 C.) along with careful control of oxygen levels during sputtering. Among other things, these process temperatures should enable the underlying electronics to survive the tungsten deposition process. As discussed below, the tungsten can be deposited such that the average residual stress is both tensile and less than 100 MPa in order to produce useable, stable structures. However, during normal sputtering, some grains of the polycrystalline tungsten generally will grow preferentially as the layer thickens, causing a columnar structure with coarser grain structure on one side than the other. This induces a stress gradient through the film, resulting in curvature when the structure is released from its sacrificial underlay. Also, a very fine grained material is strongly desired both to maintain long term stability against workhardening and to facilitate an accurate definition of Young's modulus given the anisotropy of individual crystallites.

In certain exemplary embodiments of the present invention, this is achieved by deliberately incorporating a small proportion of another material, insoluble in tungsten, which concentrates at grain boundaries, "pinning" them and preventing grain growth. A similar technique using potassium is used in incandescent light filaments to prevent sagging and also in the manufacture of tungsten tooling. However, the potassium inclusion used in filaments is incompatible with semiconductor-based electronics manufacture, as are the high temperature processes used for tooling. The inventors have found that boron and lanthanum can be used as grain growth inhibitors and further speculate that other materials also may inhibit grain growth (e.g., the oxides of zirconium, hathium, thorium, yttrium, cerium, rare earths, and also the metals copper, nickel, iron and cobalt), although these materials raise varying degrees of concern as semiconductor impurities. For example, the radioactivity of thorium would raise concerns for the reliability of memory components. The effectiveness of lanthanum and other rare-earths is thought to result from the formation of insoluble particles of their oxides during processing. The oxygen can be present in the sputtering target or introduced in the sputtering gas.

Boron additions from 0.01 to 1 atomic percent are effective, especially above 0.2% where the grain boundaries are pinned by tungsten boride particles. NASA technical note D-2649, which is hereby incorporated herein by reference, discusses boron as a possible grain growth inhibitor for tungsten in the context of macroscopic tooling and artifacts. Boron is particularly attractive because it is generally compatible with semiconductor fabrication processes.

In certain exemplary embodiments, the grain growth inhibitor (e.g., boron or lanthanum) may be provided as a dopant in the sputtering target, i.e., the grain growth inhibitor may be part of the target that is then sputtered with tungsten.

In certain other exemplary embodiments, the grain growth inhibitor may be periodically introduced during sputtering in order to stop grains from growing in the vertical direction (e.g., deposit a thin layer of tungsten, introduce grain growth inhibitor to pin the grain boundaries, deposit another thin layer of tungsten, introduce grain growth inhibitor to pin the grain boundaries, etc.). For example, boron may be used by periodically introducing some diborane into the sputtering chamber to form one or more layers that interrupt grain growth.

Third, the low temperature sputtering also enables metal electrical structures (e.g., ground plane or shielding structures and electrical interconnects) under the MEMS structures. These are incompatible with silicon structures both because the silicon deposition temperature is too high and because of the contamination risk to electronics fabrication. The interconnections made from polysilicon as used with the silicon structures are significant contributors to sensor noise because they have much larger resistance than metal (on the order of KOhms as opposed to Ohms for metals). Titanium-tungsten is a preferred material for the interconnection and shielding layers because it enables the manufacture of strong anchors and reduces the noise contribution by nearly an order of magnitude compared with polysilicon, although other materials can be used for the interconnection and shielding layers.

Fourth, the means by which an accurate, strongly anisotropic etch can be obtained is similar to that taught for silicon by Larmer et al. in U.S. Pat. No. 5,501,893 (which is hereby incorporated herein by reference) whereby the etchant is essentially fluorine generated from sulfur hexafluoride gas and a passivating layer of polytetrafluoroethylene-like polymer is generated from trifluoromethane. The process can be applied to a tungsten layer over a heat-sensitive integrated circuit because, despite its high molecular weight, tungsten hexafluoride is volatile, boiling near 20 C. at atmospheric pressure so it rapidly diffuses from the reaction site in the gaseous phase without needing to heat the substrate. The residual protective polymer, after etching, is a good electrical insulator and can cause instrument errors by trapping surface charge analogously to silicon dioxide described previously. It is therefore removed from the etched wafers with a further, brief, isotropic etch. An example of such is an oxygen-plasma as taught in U.S. Pat. No. 8,486,198 (which is hereby incorporated herein by reference) for chamber cleaning.

Exemplary Fabrication Process

An exemplary fabrication process that essentially replaces silicon-based MEMS structures and electrical interconnects with tungsten-based MEMS structures and electrical interconnects is now described with reference to FIGS. 1-12, which depict various fabrication process steps in cross-sectional views.

With regard to FIG. 1, top metal structures 102 and 104 (e.g., formed of titanium-tungsten or other appropriate electrically-conductive material) are formed on an underlying oxide layer and then covered by an overlying oxide layer 106. In this particular exemplary embodiment, the oxide layers are formed of High-Density Plasma (HDP) oxide, although alternative embodiments may use another oxide deposition fabrication process.

Figure 2:
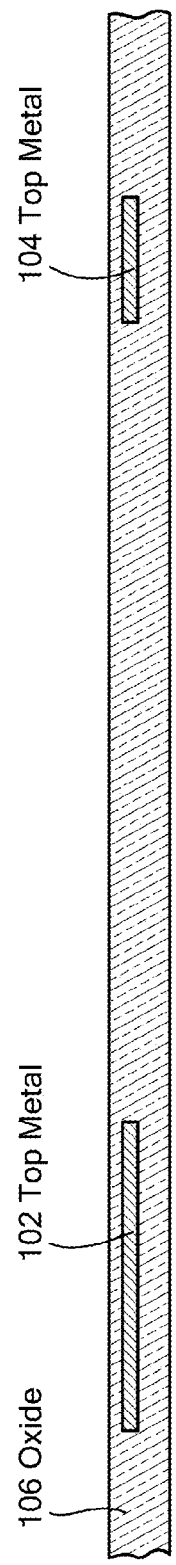

With regard to FIG. 2, the overlying oxide layer 106 is thinned, such as by grinding/polishing.

Figure 3:
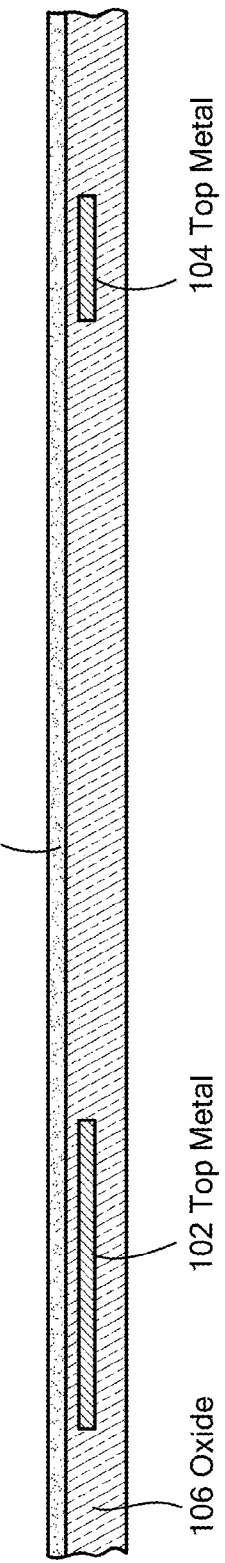

With regard to FIG. 3, a passivation layer 108 is formed on the oxide layer 106. In this particular exemplary embodiment, the passivation layer 108 is a nitride passivation layer, although alternative embodiments may use another passivation material.

Figure 4:
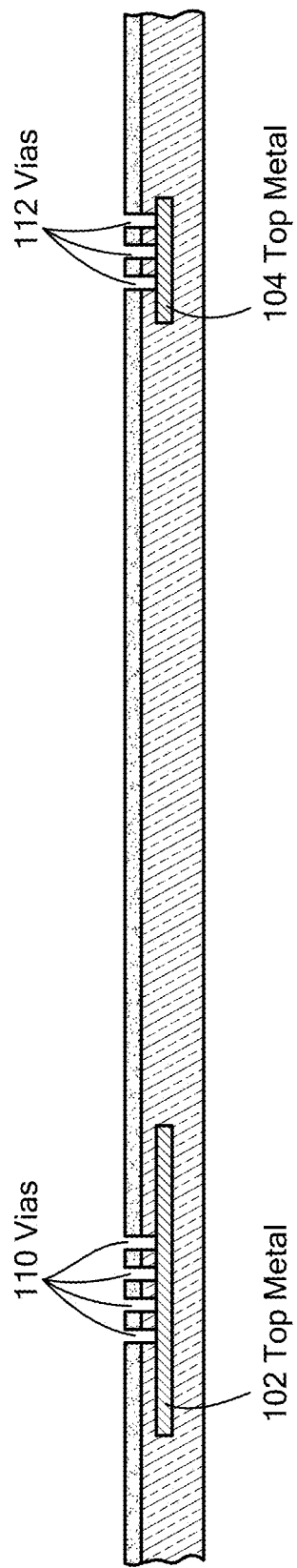

With regard to FIG. 4, sets of vias 110 and 112 are formed through the passivation layer and the oxide layer to the top metal structures 102 and 104, respectively. The vias are formed, for example, by patterning the passivation layer 108 and etching through the passivation layer 108 and the oxide layer 106.

Figure 5:
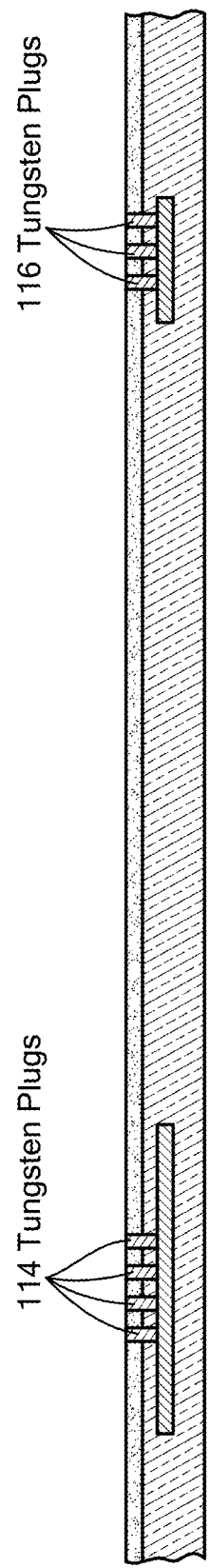

With regard to FIG. 5, the sets of vias 110 and 112 are filled with tungsten-based plugs 114 and 116, respectively. In a particular exemplary embodiment, the tungsten-based plugs may be substantially pure tungsten, although alternative embodiments may use another tungsten-based material (e.g., titanium-tungsten) or another electrically conductive material.

Figure 6:
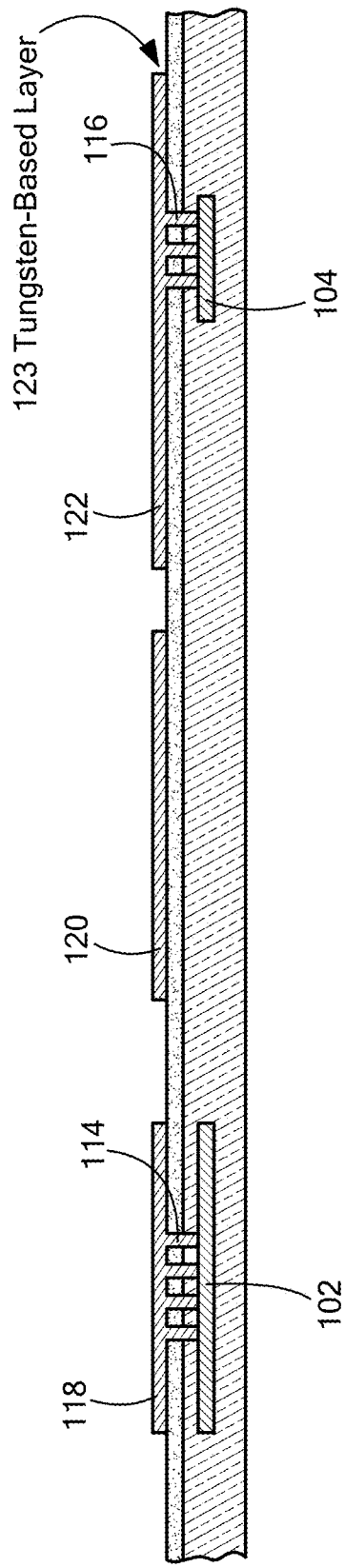

With regard to FIG. 6, tungsten-based ground plane structures 118, 120, and 122 are formed, for example, by depositing a tungsten-based material layer 123 (e.g., preferably a titanium-tungsten material) and then patterning the tungsten-based material layer 123. In this particular exemplary embodiment, the ground plane structure 118 is electrically connected to the top metal structure 102 by way of vias 114, while ground plane structures 120 and 122 are electrically connected to the top metal structure 104 by way of vias 116 (the electrical connectivity of ground plane structure 120 is not expressly shown due to the cross-sectional nature of the drawings).

Figure 7:
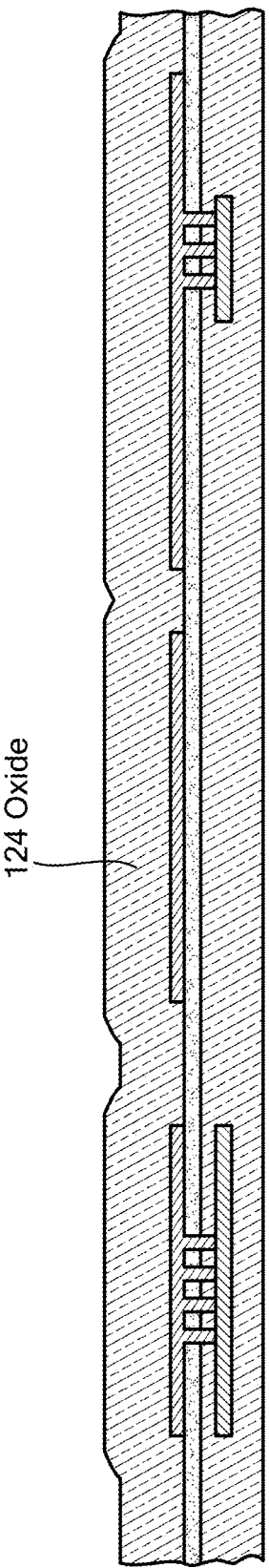
Figure 8:
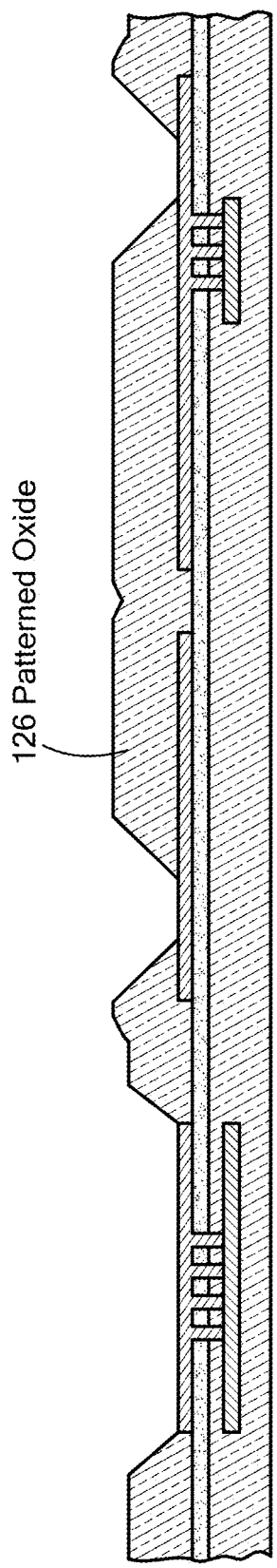

With regard to FIG. 7, a sacrificial (spacer) oxide layer 124 is formed over the ground plane structures. Among other things, this oxide layer 124 is used to support various releasable tungsten MEMS structures that are formed in later process steps. With regard to FIG. 8, the oxide layer 124 is patterned to form a patterned oxide layer 126 so as to expose portions of the ground plane structures.

Figure 9:
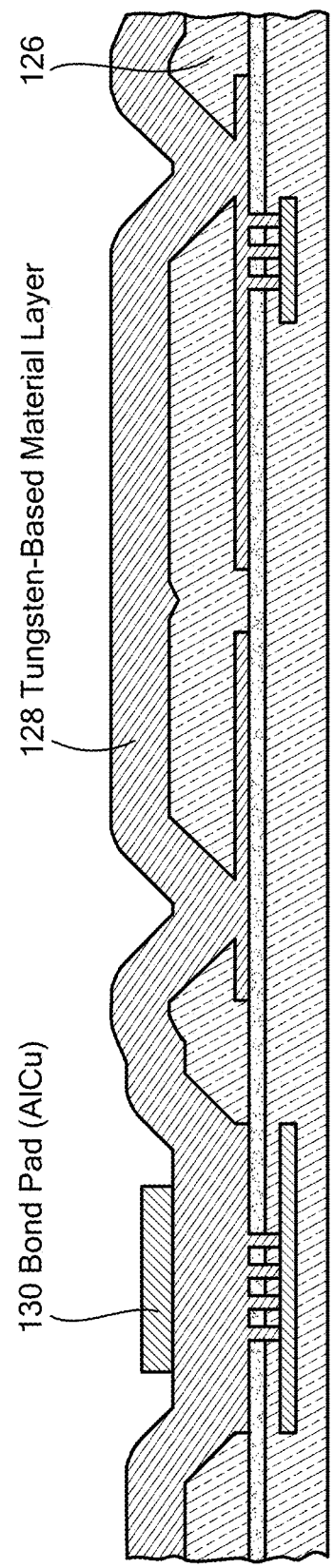

With regard to FIG. 9, a thick (i.e., greater than or equal to around 2 microns thick) tungsten-based material layer 128 is formed on the patterned oxide layer 126 and exposed portions of the ground plane structures. Importantly, the tungsten-based material is deposited at low temperature under around 500 C. without densifying the underlying oxide layer 124/126. Densification of the underlying oxide is generally required for deposition of silicon-based materials due to the high temperatures at which silicon-based materials are generally deposited. Thus, this exemplary fabrication process eliminates the step of densifying the underlying oxide layer, which saves fabrication time (and hence reduces cost) and also avoids a high-temperature process that could damage electronic circuitry. Subsequently, a bond pad 130 is formed on the tungsten-based material layer 128 on a portion above the ground plane structure 118. In this particular exemplary embodiment, the bond pad 130 is formed of an AlCu material, although alternative embodiments may use another electrically conductive material.

Figure 10:
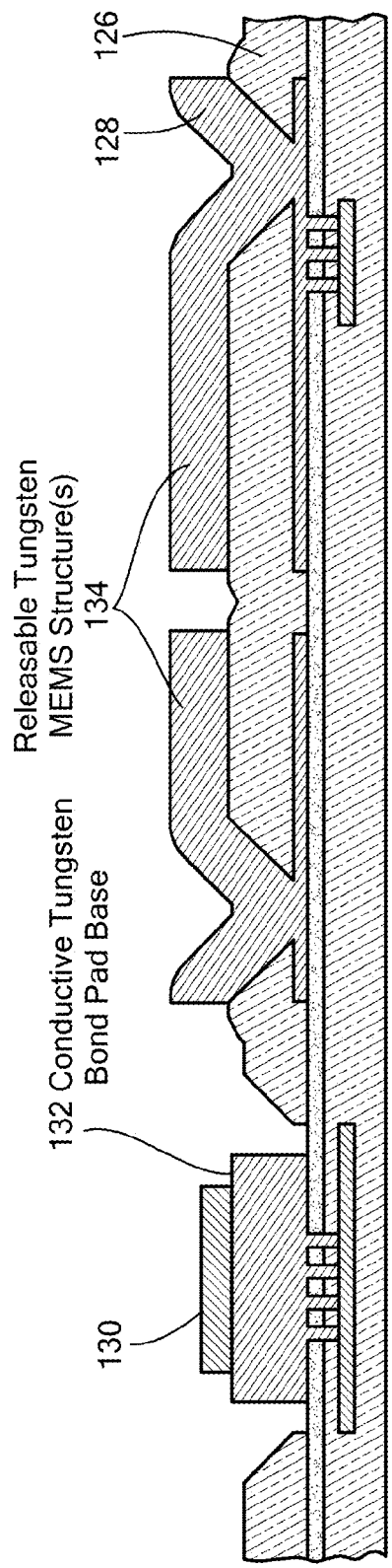

With regard to FIG. 10, the tungsten-based material layer 128 is patterned to form releasable tungsten MEMS structure(s) 134 (e.g., a gyroscope resonator or an accelerometer proof mass) as well as a conductive tungsten bond pad base 132. As discussed above, in a particular exemplary embodiment, an accurate, strongly anisotropic etch can be obtained in a manner similar to that taught for silicon by Larmer et al. in U.S. Pat. No. 5,501,893 (which is hereby incorporated herein by reference) whereby the etchant is essentially fluorine generated from sulfur hexafluoride gas (SF6) and a passivating layer of polytetrafluoroethylene-like polymer is generated from trifluoromethane. In this particular exemplary embodiment, the residual protective polymer, after etching, is removed from the etched wafers with a further, brief, isotropic etch using an oxygen-plasma substantially as taught in U.S. Pat. No. 8,486,198 (which is hereby incorporated herein by reference) for chamber cleaning.

With continued reference to FIG. 10, the conductive tungsten bond pad base 132 and the bond pad 130 provide a bond site for a metallic cap. The conductive tungsten bond pad base 132 and the bond pad 130 may (and typically do) fully surround the releasable tungsten MEMS structure(s) 134 and other related MEMS structures (e.g., various drive and sense electrodes) that are not shown for convenience. For convenience, only one bond site for capping is shown in the drawing.

Figure 11:
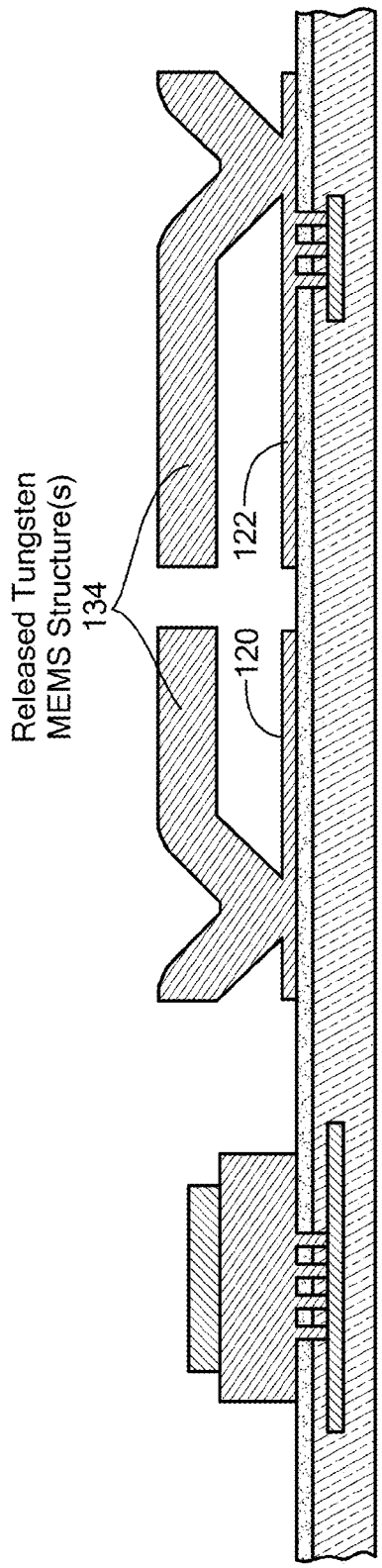

With regard to FIG. 11, the oxide layer 126 is removed so as to release the tungsten MEMS structures 134. An HF wet etch technique may be used to remove the oxide layer 126.

With regard to FIG. 12, a metal cap 136 is bonded to the bond pad 130 to seal (typically hermetically) the MEMS device. In this particular exemplary embodiment, the metal cap 136 is electrically connected to the top metal structure 102 by way of bond pad 130, bond pad base 132, and vias 114.

It should be noted that the exemplary fabrication process discussed above may include (and often does include) additional and/or alternate fabrication steps that are omitted here for convenience. For example, patterning of a particular material layer may include various deposition and etching steps. Also, additional structures may be formed at the shown layers and/or at various additional layers. For example, various tungsten-based electrodes such as for driving and/or sensing movement of a tungsten-based movable mass may be formed from the tungsten-based material layer 123 (e.g., electrodes underlying the movable mass) and/or from the tungsten-based material layer 128 (e.g., electrodes alongside the movable mass).

Pedestals to Prevent Stiction During Mems Release

In order to prevent stiction of the releasable MEMS structures during the releasing operation, various alternative embodiments may utilize one or more pedestals to support the releasable MEMS structures during the releasing operations, for example, as described in U.S. Pat. No. 5,314,572 (which is hereby incorporated herein by reference).

FIGS. 13-18 depict various fabrication processes for use of a pedestal, in accordance with one exemplary embodiment. FIGS. 13-18 essentially would replace FIGS. 8-11 in the exemplary fabrication process described above.

With regard to FIG. 13, the oxide layer 124 is patterned to form a patterned oxide layer 126 so as to expose portions of the ground plane structures and also form an opening 1302 for a pedestal.

With regard to FIG. 14, a pedestal 1304 is formed in the opening 1302, e.g., from a photoresist material or other suitable material that can support the releasable MEMS structures and be removed after released of the MEMS structures.

Figure 15:
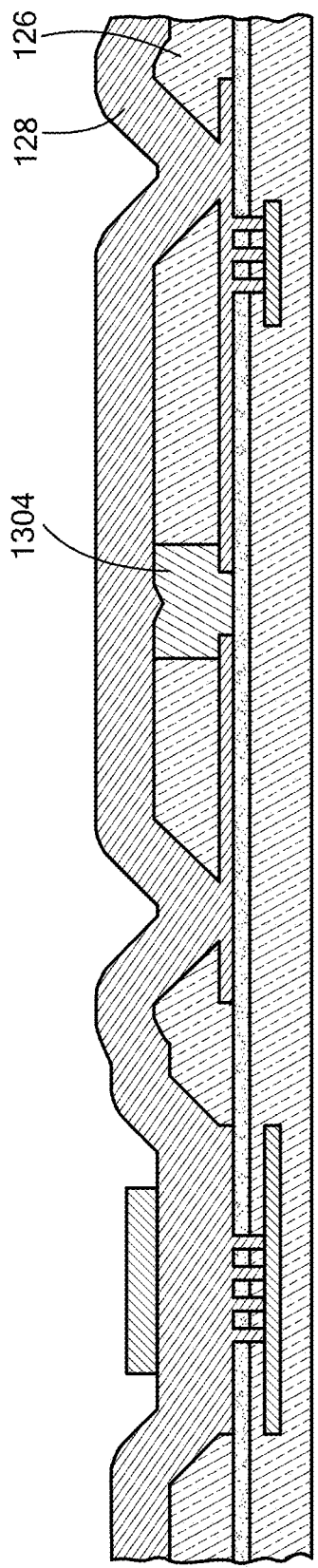

With regard to FIG. 15, a thick (i.e., greater than or equal to around 2 microns thick) tungsten-based material layer 128 is formed on the patterned oxide layer 126 and exposed portions of the ground plane structures and exposed portion of the pedestal 1304. Importantly, the tungsten-based material is deposited at low temperature under around 500 C. without densifying the underlying oxide layer 124/126. Densification of the underlying oxide is generally required for deposition of silicon-based materials due to the high temperatures at which silicon-based materials are generally deposited. Thus, this exemplary fabrication process eliminates the step of densifying the underlying oxide layer, which saves fabrication time (and hence reduces cost) and also avoids a high-temperature process that could damage electronic circuitry. Subsequently, a bond pad 130 is formed on the tungsten-based material layer 128 on a portion above the ground plane structure 118. In this particular exemplary embodiment, the bond pad 130 is formed of an AlCu material, although alternative embodiments may use another electrically conductive material.

Figure 16:
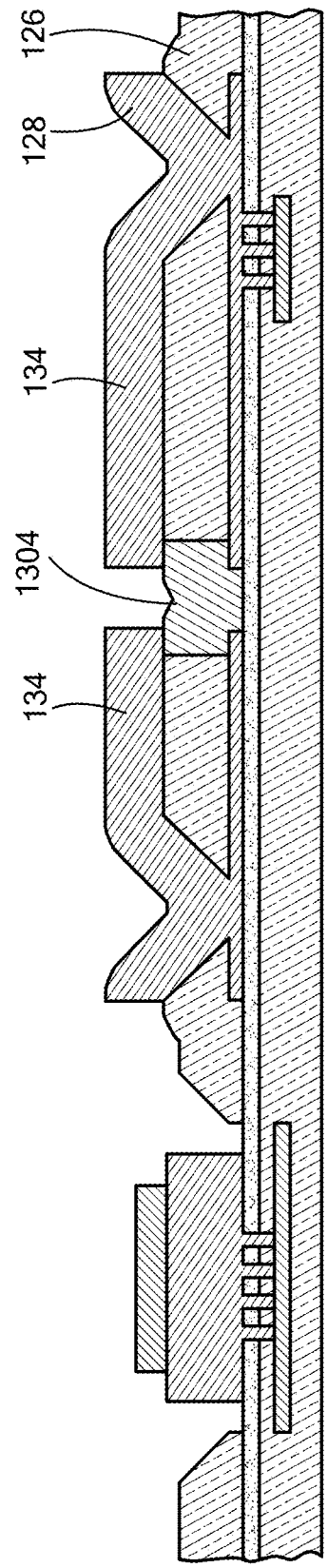

With regard to FIG. 16, the tungsten-based material layer 128 is patterned to form releasable tungsten MEMS structure(s) 134 (e.g., a gyroscope resonator or an accelerometer proof mass) as well as a conductive tungsten bond pad base 132. As discussed above, in a particular exemplary embodiment, an accurate, strongly anisotropic etch can be obtained in a manner similar to that taught for silicon by Larmer et al. in U.S. Pat. No. 5,501,893 (which is hereby incorporated herein by reference) whereby the etchant is essentially fluorine generated from sulfur hexafluoride gas (SF6) and a passivating layer of polytetrafluoroethylene-like polymer is generated from trifluoromethane. In this particular exemplary embodiment, the residual protective polymer, after etching, is removed from the etched wafers with a further, brief, isotropic etch using an oxygen-plasma substantially as taught in U.S. Pat. No. 8,486,198 (which is hereby incorporated herein by reference) for chamber cleaning. It should be noted that the patterning of the tungsten-based material layer 128 leaves the pedestal 1304 intact so that the pedestal 1304 supports the releasable MEMS structures 134.

With regard to FIG. 17, the oxide layer 126 is removed (e.g., through additional holes etched in the releasable MEMS structures 134, which, for convenience, are not shown or described but are known to those skilled in the art) so as to release the tungsten MEMS structures 134. An HF wet etch technique may be used to remove the oxide layer 126. It should be noted that the removal of the oxide layer 126 leaves the pedestal 1304 intact so that the pedestal 1304 supports the releasable MEMS structures 134.

With regard to FIG. 18, the pedestal 1304 is removed to fully release the MEMS structures 134. An oxygen plasma etching technique may be used to remove a photoresist pedestal 1304.

It should be noted that the exemplary fabrication process discussed above may include (and often does include) additional and/or alternate fabrication steps that are omitted here for convenience. For example, patterning of a particular material layer may include various deposition and etching steps. Also, additional structures may be formed at the shown layers and/or at various additional layers. For example, various tungsten-based electrodes such as for driving and/or sensing movement of a tungsten-based movable mass may be formed from the tungsten-based material layer 123 (e.g., electrodes underlying the movable mass) and/or from the tungsten-based material layer 128 (e.g., electrodes alongside the movable mass).

Lateral Drive/Sense Electrodes

As discussed above, electrodes for driving and/or sensing movement of a movable mass may be formed of a tungsten-based material. For example, ground plane structures 120 and 122 may be formed from a tungsten-based material in certain specific exemplary embodiments, for example, to drive and/or sense out-of-plane movement of movable MEMS structures 134.

It should be noted that lateral electrodes additionally or alternatively may be formed of a tungsten-based material, for example, to drive and/or sense in-plane movement a tungsten-based movable mass. In particular, lateral electrodes may be formed from the same tungsten-based material layer as the movable mass itself (e.g., from layer 128 shown in FIG. 9). Some exemplary lateral electrodes are described, for example, in U.S. Patent Application Publication No. U.S. 2012/0137773, which is hereby incorporated herein by reference in its entirety. For example, the patterning of the tungsten-based material layer 128 shown and described with reference to FIG. 10 may include formation of one or more lateral electrodes adjacent to a movable mass, and with an accurate, strongly anisotropic etch of the type described above, high aspect ratio MEMS devices such as bulk acoustic wave (BAW) gyroscopes can be formed where the electrodes are placed very close to the mass. As with the movable structures MEMS structures 134, lateral electrodes may be electrically connected to underlying circuitry using tungsten-based electrical interconnects.

Tungsten Anchors

FIGS. 11 and 18 show the movable MEMS structures 134 formed directly on the ground plane structures 120 and 122. In various alternative embodiments, the movable MEMS structures 134 instead may be anchored to the ground plane structures 120 and 122 or to other tungsten-based structures using one or more tungsten-based anchors.

Other structures, such as electrodes, may be similarly anchored using tungsten-based anchors.

Figure 19:
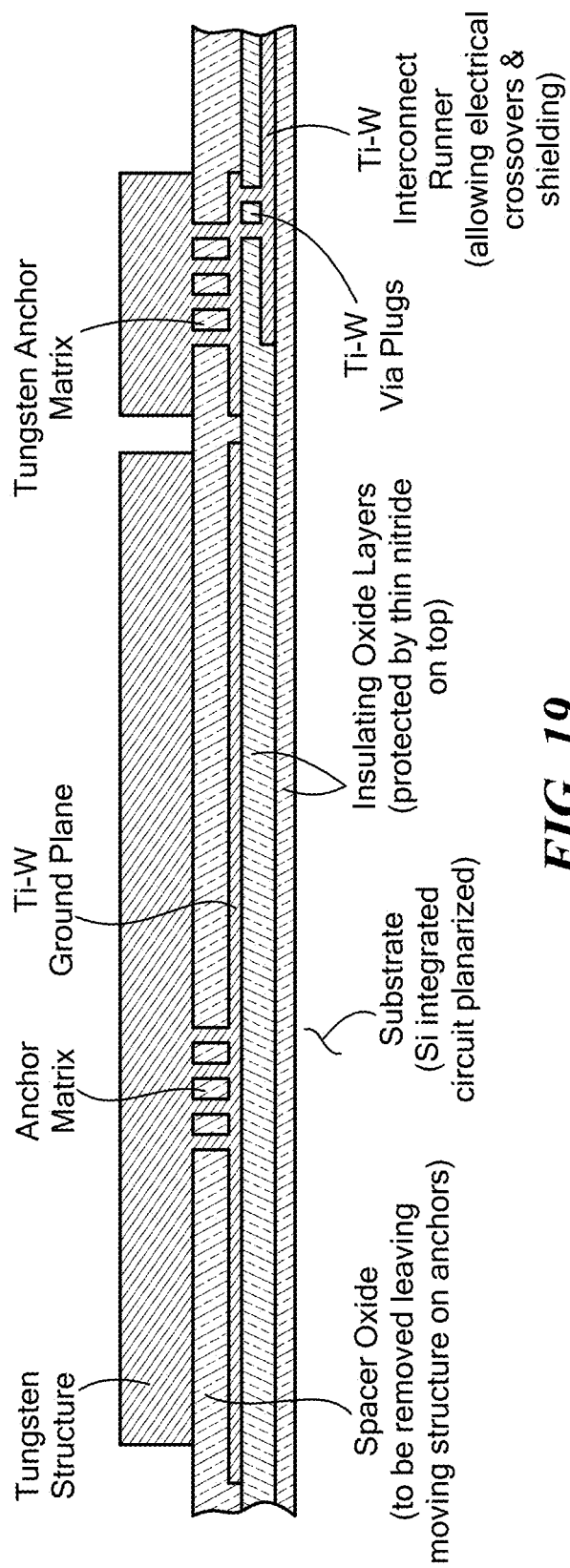
FIG. 19 depicts a matrix of small tungsten-based anchors (e.g., around 1 micron each) for us in place of a single large tungsten-based anchor, in accordance with one specific exemplary embodiment.

In one particular exemplary embodiment, a matrix of small tungsten-based anchors (e.g., around 1 micron each) is used in place of a single large tungsten-based anchor, as depicted in FIG. 19. The inventors have found that such small anchors, too weak to be individually useful, are filled uniformly without voids or cracks and form a composite anchor that is sufficiently strong.

FIGS. 20-23 depict various fabrication processes for formation of tungsten-based anchors for anchoring the releasable MEMS structures, in accordance with one exemplary embodiment. FIGS. 20-23 essentially would replace FIGS. 8-10 in the exemplary fabrication process described above.

Figure 20:
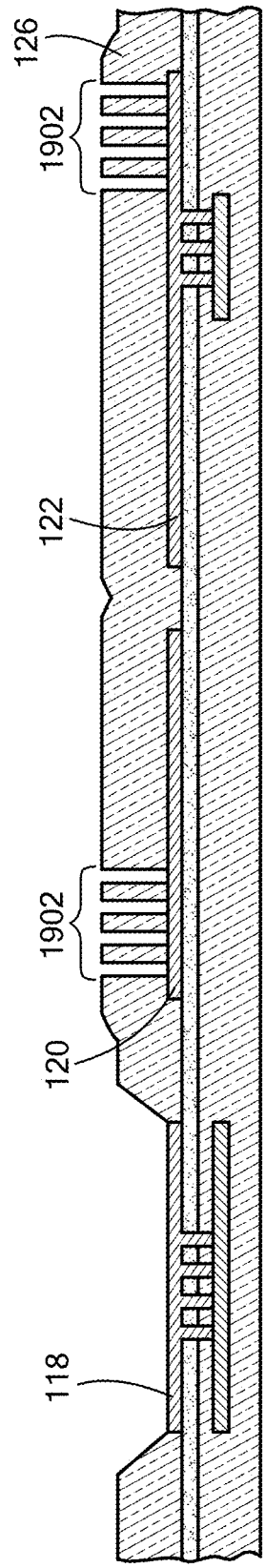
FIGS. 20-23 depict various fabrication processes for formation of tungsten-based anchors for anchoring the releasable MEMS structures as depicted in FIG. 19.
Figure 21:
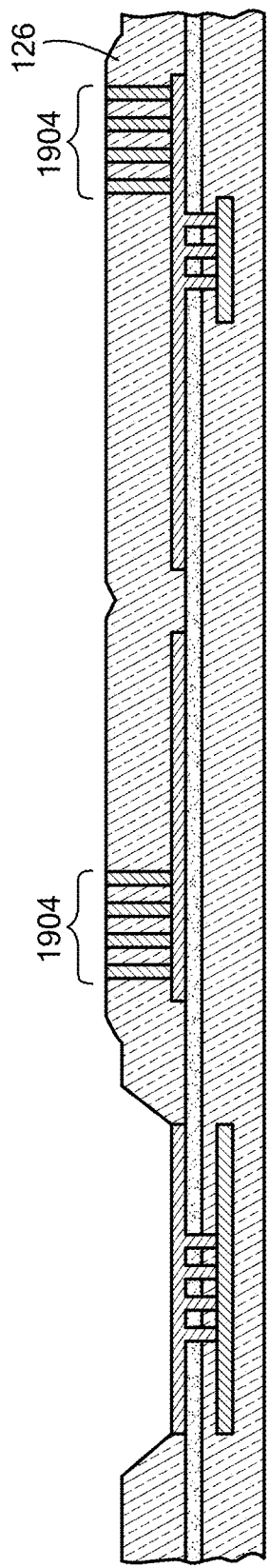

With regard to FIG. 20, the oxide layer 124 is patterned to form a patterned oxide layer 126 including a matrix of small holes 1902 (e.g., around 1 micron each) for the matrix of small anchors and also exposing a portion of the ground plane structure 118. With regard to FIG. 21, the holes 1902 are filled with tungsten-based plugs 1904 to form anchors, preferably of the same tungsten-based material used to form the tungsten-based movable MEMS structures (e.g., substantially pure tungsten, where the ground plane structures 120 and 122 may be formed of titanium-tungsten).

Figure 22:
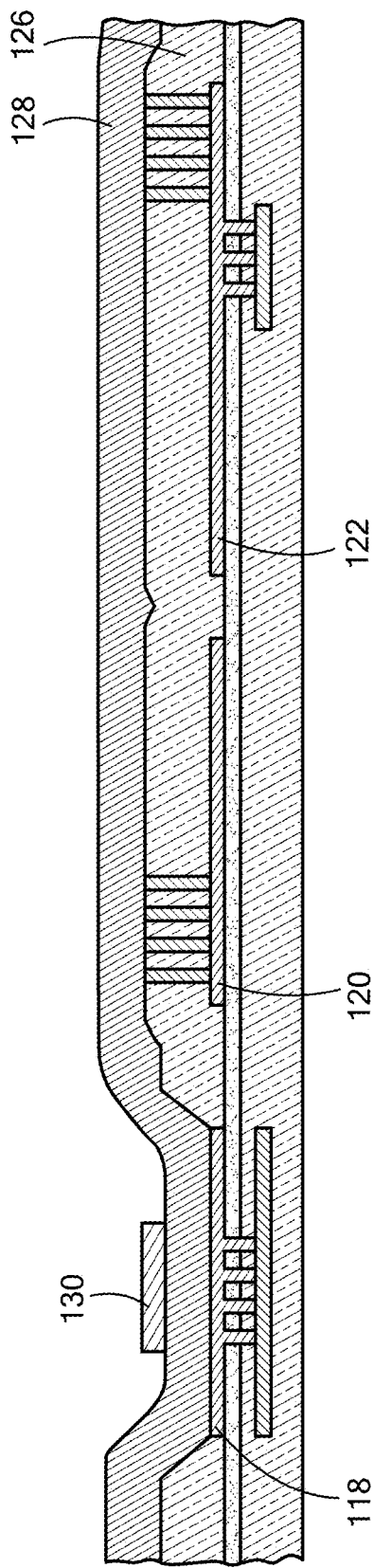

With regard to FIG. 22, a thick (i.e., greater than or equal to around 2 microns thick) tungsten-based material layer 128 is formed on the patterned oxide layer 126 and exposed portions of the ground plane structure 118. Importantly, the tungsten-based material is deposited at low temperature under around 500 C. without densifying the underlying oxide layer 124/126. Densification of the underlying oxide is generally required for deposition of silicon-based materials due to the high temperatures at which silicon-based materials are generally deposited. Thus, this exemplary fabrication process eliminates the step of densifying the underlying oxide layer, which saves fabrication time (and hence reduces cost) and also avoids a high-temperature process that could damage electronic circuitry. Subsequently, a bond pad 130 is formed on the tungsten-based material layer 128 on a portion above the ground plane structure 118. In this particular exemplary embodiment, the bond pad 130 is formed of an AlCu material, although alternative embodiments may use another electrically conductive material.

Figure 23:
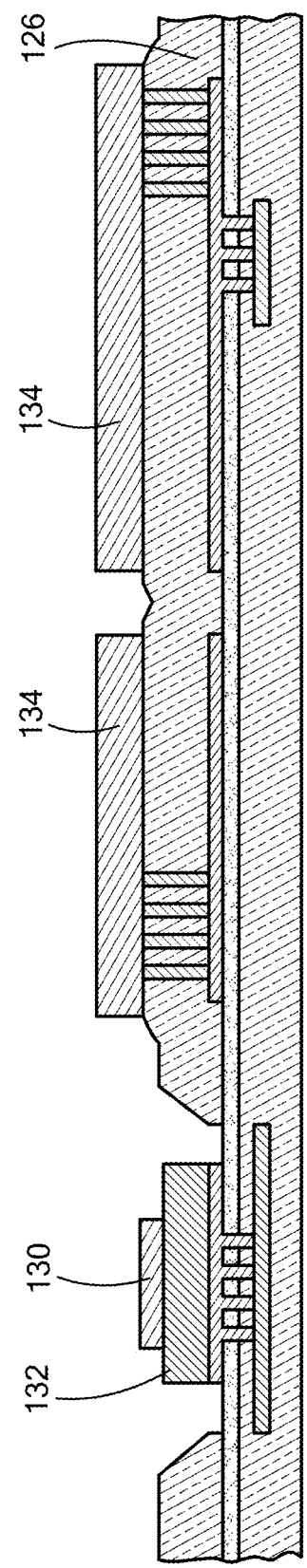

With regard to FIG. 23, the tungsten-based material layer 128 is patterned to form releasable tungsten MEMS structure(s) 134 (e.g., a gyroscope resonator or an accelerometer proof mass) as well as a conductive tungsten bond pad base 132. As discussed above, in a particular exemplary embodiment, an accurate, strongly anisotropic etch can be obtained in a manner similar to that taught for silicon by Larmer et al. in U.S. Pat. No. 5,501,893 (which is hereby incorporated herein by reference) whereby the etchant is essentially fluorine generated from sulfur hexafluoride gas (SF6) and a passivating layer of polytetrafluoroethylene-like polymer is generated from trifluoromethane. In this particular exemplary embodiment, the residual protective polymer, after etching, is removed from the etched wafers with a further, brief, isotropic etch using an oxygen-plasma substantially as taught in U.S. Pat. No. 8,486,198 (which is hereby incorporated herein by reference) for chamber cleaning.

In another particular exemplary embodiment, rather than using a matrix of small anchors, one or more large anchors may be used, essentially by forming the anchor(s) in the oxide layer 126 substantially as discussed above with regard to FIGS. 20-23.

Figure 24:
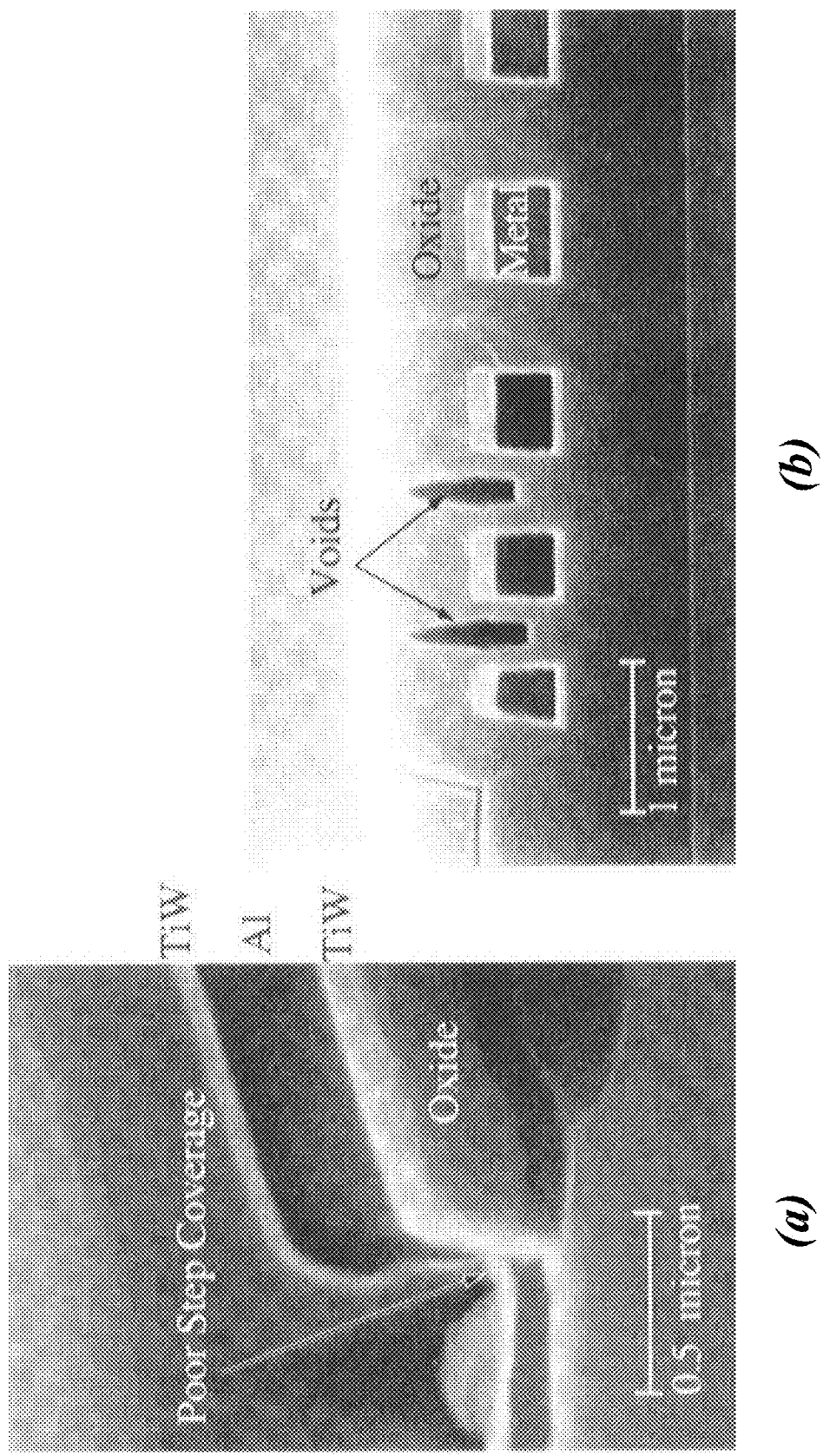
FIG. 24 depicts the phenomenon of "breadloafing" for sputtered metal layers, as known in the art.

However, the inventors have found that the deposition of large tungsten-based anchors can be complicated by the phenomenon of "breadloafing" well known in semiconductor processing when depositing other materials such as silicon dioxide. A diagram of "breadloafing" can be found in U.S. Pat. No. 6,204,200 or for sputtered metal layers in FIG. 24. "Breadloafing" produces voids in material deposited in etched cavities with steep walls, such as those used in the sacrificial oxide of MEMS to form anchors. The inventors have found that when fabricating tungsten anchors large enough to be usefully strong, the resulting voids can extend as fine cracks which spoil the mechanical integrity.

Thus, in specific exemplary embodiments, large tungsten-based anchors are formed by etching the cavities in the oxide layer 126 in stages such that the cavities are much wider at the top than at the bottom. The lack of steep sidewalls allows these cavities to fill uniformly with tungsten, thereby forming anchors with various cross-sections, depending on etch, but typified by substantially "V" shaped anchors.

FIGS. 25-28 depict various fabrication processes for formation of tungsten-based anchors for anchoring the releasable MEMS structures, in accordance with one exemplary embodiment.

With regard to FIG. 25, a first etch forms partial cavities 2502.

With regard to FIG. 26, a second etch forms wider and deeper cavities 2504.

Figure 27:
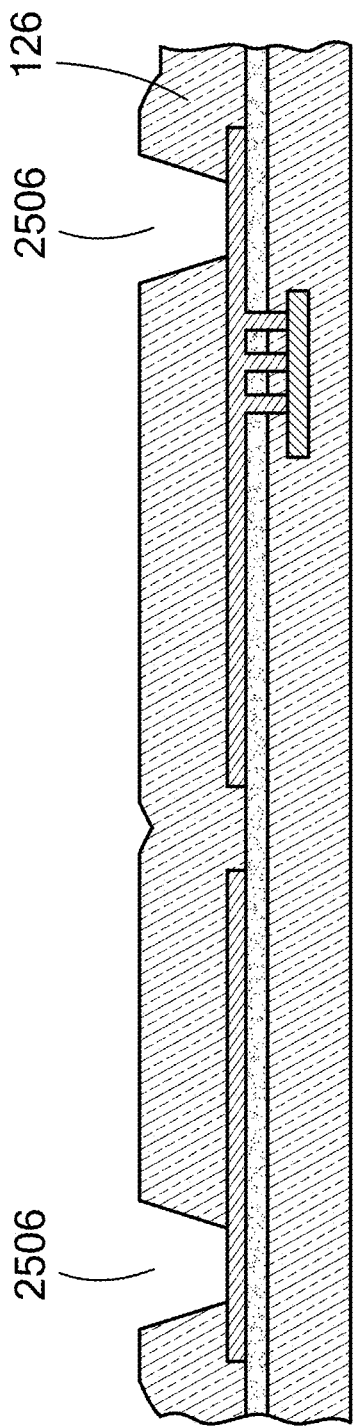

With regard to FIG. 27, a third etch forms the final cavities 2506.

Figure 28:
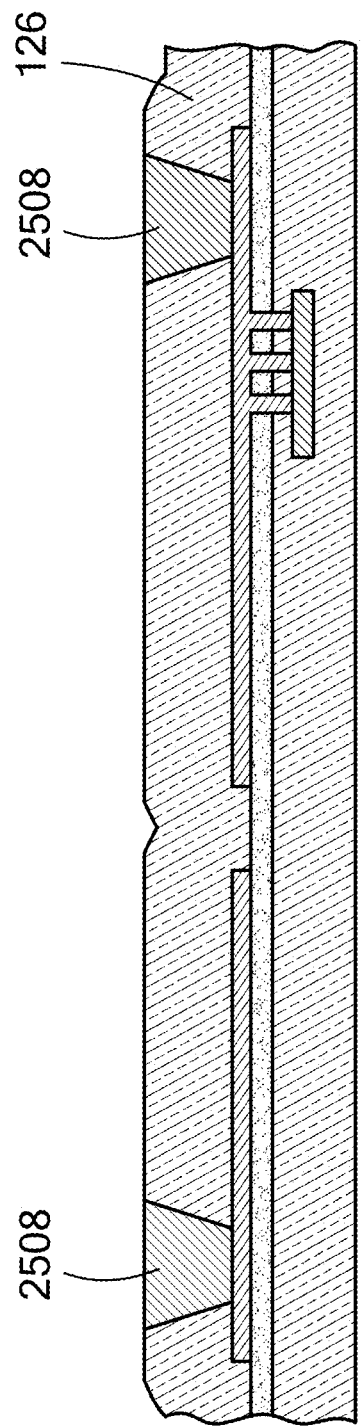

With regard to FIG. 28, the cavities 2506 are filled with tungsten-based material to form large anchors. The movable MEMS structures (not shown) can then be formed over the oxide layer 126 and anchors 2506.

It should be noted that the exemplary fabrication processes discussed above may include (and often do include) additional and/or alternate fabrication steps that are omitted here for convenience. For example, patterning of a particular material layer may include various deposition and etching steps. Also, additional structures may be formed at the shown layers and/or at various additional layers. For example, various tungsten-based electrodes such as for driving and/or sensing movement of a tungsten-based movable mass may be formed from the tungsten-based material layer 123 (e.g., electrodes underlying the movable mass) and/or from the tungsten-based material layer 128 (e.g., electrodes alongside the movable mass).

It should be noted that other structures, such as non-movable tungsten-based electrode structures, may be anchored using tungsten-based plugs. For example, tungsten-based anchors may be used in electrode configurations of the types described in U.S. Patent Application Publication No. U.S. 2012/0137773, which is hereby incorporated herein by reference in its entirety. Among other things, anchored electrodes are generally less susceptible to deflections caused by interactions with a movable mass, particularly in high aspect ratio MEMS devices such as bulk acoustic wave (BAW) gyroscopes where the electrodes are placed very close to the mass.

Test Results

Figure 29:
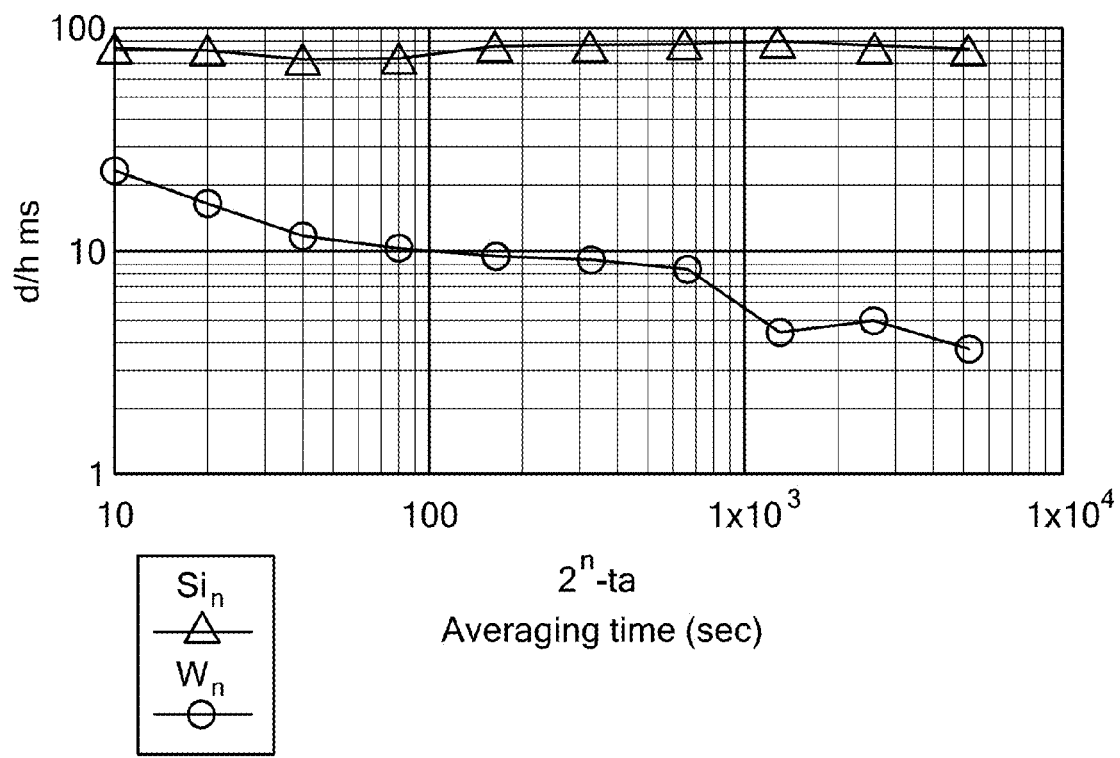
FIG. 29 is a graph showing Allan Deviation plots for the tungsten-based gyroscope and the silicon-based gyroscope showing the improved resolution floor of the tungsten-based gyroscope.

The inventors performed real-world testing of a tungsten-based gyroscope based on the design and geometries of Analog Devices iMEMS ADXRS640 with the shield-plane, runners and sensor structure fabricated in 2.5 um tungsten rather than 4 um silicon. Thus, the inventors expected to see around 2 to 4 times better noise performance from the tungsten-based gyroscope than the silicon-based gyroscope when operated under the same conditions. The silicon and tungsten structures were expected to have about the same deflections when operated at the same voltage with the same atmosphere, and the inventors found that the tungsten-based gyroscopes resonated with their integrated electronics near the expected frequency with the expected Q and the expected amplitude of motion. Importantly, the inventors found that the resolution floor of the tungsten-based gyroscope seems improved over silicon by a large margin, showing that the tungsten-based gyroscope has better long-term stability than the silicon-based gyroscope. This was expected from the larger Coriolis force and lack of insulating surface to trap charge (the surface oxides of tungsten are conductive, while the surface oxides of silicon are insulating). FIG. 29 is a graph showing Allan Deviation plots for the tungsten-based gyroscope and the silicon-based gyroscope showing the improved resolution floor of the tungsten-based gyroscope.

Miscellaneous

It should be noted that headings are used above for convenience and are not to be construed as limiting the present invention in any way.

Various embodiments of the present invention may be characterized by the potential claims listed in the paragraphs following this paragraph (and before the actual claims provided at the end of this application). These potential claims form a part of the written description of this application. Accordingly, subject matter of the following potential claims may be presented as actual claims in later proceedings involving this application or any application claiming priority based on this application. Inclusion of such potential claims should not be construed to mean that the actual claims do not cover the subject matter of the potential claims. Thus, a decision to not present these potential claims in later proceedings should not be construed as a donation of the subject matter to the public.

Without limitation, potential subject matter that may be claimed (prefaced with the letter "P" so as to avoid confusion with the actual claims presented below) includes:

P15. A method of anchoring a MEMS structure to an underlying substrate of a MEMS device using a matrix of small tungsten-based anchors in lieu of a single large tungsten-based anchor, the method comprising:
  patterning an oxide layer to form a patterned oxide layer including a matrix of small holes of around 1 micron in diameter each through the oxide layer to the underlying substrate;
  filling the holes with tungsten-based plugs to form the matrix of small tungsten-based anchors; and
  forming a thick tungsten-based material layer at least 2 microns in thickness on the patterned oxide layer, wherein the tungsten-based material layer is deposited at low temperature under around 500 C. without densifying the underlying oxide layer, and wherein the thick tungsten-based material layer is anchored to the underlying substrate by the matrix of small tungsten-based anchors.

P16. A method according to claim P15, wherein the underlying substrate is a ground plane structure of the MEMS device.

P17. A method according to claim P16, wherein the tungsten-based plugs are formed of substantially pure tungsten and wherein the ground plane structure is formed of titanium-tungsten.

P18. A method according to claim P15, wherein the holes are filled uniformly without voids or cracks.

P19. A method according to claim P15, wherein the tungsten-based anchors and the tungsten-based material layer are formed of the same tungsten-based material.

P20. A method according to claim P15, further comprising:
  patterning the tungsten-based material layer to form a releasable tungsten-based MEMS structure anchored to the underlying substrate by the matrix of small tungsten-based anchors.

P21. A MEMS device comprising:
  a substrate;
  a non-densified oxide layer on the substrate, the non-densified oxide layer including a matrix of small tungsten-based anchors of around 1 micron in diameter each extending through the oxide layer to the substrate; and
  a thick tungsten-based MEMS structure at least 2 microns in thickness on the oxide layer and anchored to the underlying substrate by the matrix of small tungsten-based anchors.

P22. A MEMS device according to claim P21, wherein the substrate is a ground plane structure of the MEMS device.

P23. A MEMS device according to claim P22, wherein the tungsten-based plugs are formed of substantially pure tungsten and wherein the ground plane structure is formed of titanium-tungsten.

P24. A MEMS device according to claim P21, wherein the tungsten-based anchors are filled uniformly without voids or cracks.

P25. A MEMS device according to claim P21, wherein the tungsten-based anchors and the tungsten-based material layer are formed of the same tungsten-based material.

P26. A MEMS device according to claim P21, wherein the MEMS structure is a releasable MEMS structure.

P27. A method of anchoring a MEMS structure to an underlying substrate of a MEMS device using a large tungsten-based anchor, the method comprising:
  patterning an oxide layer including etching a cavity in the oxide layer using a plurality of etching steps that incrementally increase the width and depth of the cavity such that the cavity extends through the oxide layer to the underlying substrate and is substantially wider at the top than at the bottom;
  filling the cavity uniformly with a tungsten-based material to form a large tungsten-based anchor; and
  forming a thick tungsten-based material layer at least 2 microns in thickness on the patterned oxide layer, wherein the tungsten-based material layer is deposited at low temperature under around 500 C. without densifying the underlying oxide layer, and wherein the thick tungsten-based material layer is anchored to the underlying substrate by the large tungsten-based anchor.

P28. A method according to claim P27, wherein the underlying substrate is a ground plane structure of the MEMS device.

P29. A method according to claim P28, wherein the large tungsten-based anchor is formed of substantially pure tungsten and wherein the ground plane structure is formed of titanium-tungsten.

P30. A method according to claim P27, wherein the cavity is filled uniformly without voids or cracks.

P31. A method according to claim P27, wherein the tungsten-based anchor and the tungsten-based material layer are formed of the same tungsten-based material.

P32. A method according to claim P27, further comprising:
  patterning the tungsten-based material layer to form a releasable tungsten-based MEMS structure anchored to the underlying substrate by the large tungsten-based anchor.

P38. A MEMS device comprising:
  a substrate;
  a non-densified oxide layer on the substrate, the non-densified oxide layer including a large tungsten-based anchor that is substantially wider at the top than at the bottom and that extends through the oxide layer to the substrate; and
  a thick tungsten-based MEMS structure at least 2 microns in thickness on the oxide layer and anchored to the underlying substrate by the large tungsten-based anchor.

P39. A MEMS device according to claim P38, wherein the substrate is a ground plane structure of the MEMS device.

P40. A MEMS device according to claim P39, wherein the large tungsten-based anchor is formed of substantially pure tungsten and wherein the ground plane structure is formed of titanium-tungsten.

P41. A MEMS device according to claim P38, wherein the large tungsten-based anchor is filled uniformly without voids or cracks.

P42. A MEMS device according to claim P38, wherein the large tungsten-based anchor and the tungsten-based material layer are formed of the same tungsten-based material.

P43. A MEMS device according to claim P38, wherein the MEMS structure is a releasable MEMS structure.

The present invention may be embodied in other specific forms without departing from the true scope of the invention, and numerous variations and modifications will be apparent to those skilled in the art based on the teachings herein. Any references to the "invention" are intended to refer to exemplary embodiments of the invention and should not be construed to refer to all embodiments of the invention unless the context otherwise requires. The described embodiments are to be considered in all respects only as illustrative and not restrictive.

APPENDIX A – IDEAL RATE NOISE OF Z-AXIS, COMB-DRIVEN, GAS-DAMPED GYROS IN TERMS OF PROCESS PARAMETERS

Here is an approximate formula which can be used to compare processes quantitatively but without needing make all the tradeoffs and rather complicated calculations needed to do trial designs. It explicitly includes optimization for the process rather than using a fixed geometry and is thereby a fairer comparison than the rather exaggerated ranking from the previous "figure of merit", although it gives the same qualitative result. This is for air gyros as derived in Appendix B. See Appendix C for vacuum gyros.

The derivation is in Appendix B.

All units are SIU except $\Omega n$.
$\Omega n$ is a rate noise spectral density in (deg./sec.)/rt.Hz.
b=structure thickness:  g=minimum feature:  h=sacrificial layer thickness
E=Young's modulus:  $\rho$=density:  $\zeta$=air viscosity
V=applied voltage:  Vn=differential amplifier input noise:  Ct=finger termination capacitance Common parameters:

$u := 10^{-6}$  $\varepsilon := 8.9 \cdot 10^{-12}$  $Vn := 12 \cdot 10^{-9}$  $fo := 22000$  $k := 1.4 \cdot 10^{-23}$  $T := 300$ $\zeta := 6 \cdot u$  (capping with 70mbar air at 700K)

$$\Omega n(b,g,h,E,\rho,Ct,V) := \left(\frac{700}{b \cdot h}\right)\left[1 + 8 \cdot h \cdot \sqrt{\frac{fo \cdot 2.5}{b \cdot \sqrt{\frac{E}{\rho}}}} \left(\frac{b}{g}\right)^3\right] \cdot \left(\frac{Ct \cdot Vn \cdot g^4 \cdot fo^2 \cdot \zeta^4 \cdot kT}{\varepsilon^4 \cdot V^7 \cdot \rho^2}\right)^{\frac{1}{3}} \quad \text{deg/rt.sec}$$

4um Silicon 21V BiMOS  $\quad \Omega n(4 \cdot u, 3 \cdot u, 2 \cdot u, 163 \cdot 10^9, 2333, 10 \cdot 10^{-15}, 21) = 6.9 \times 10^{-3}$
This is roughly what we get in production silicon gyros.

4um Tungsten 21V BiMOS  $\quad \Omega n(4 \cdot u, 2 \cdot u, 2 \cdot u, 410 \cdot 10^9, 19254, 5 \cdot 10^{-15}, 21) = 9.0 \times 10^{-4}$
Tungsten gives more than 7x improvement.

2.5um Tungsten 21V BiMOS  $\quad \Omega n(2.5 \cdot u, 3 \cdot u, 2 \cdot u, 410 \cdot 10^9, 19254, 5 \cdot 10^{-15}, 21) = 2.1 \times 10^{-3}$
Thinner gives 3x improvement.

APPENDIX B: DERIVATION FOR GAS-DAMPED GYROS

The useable frequency range in a given width (W) and thickness (b) structure is bounded above by the first flexural out-of-plane mode. This frequency is usually highest for a roughly square design and, in practice, is a little lower than the first mode of a simply supported square plate of the same size. The frequency of that plate mode is given in "Roark" as:

$$fp = \pi \cdot \frac{b}{W^2} \sqrt{\frac{E}{12 \cdot \rho \cdot (1 - \nu^2)}}$$ where E is the material modulus, $\rho$ its density and $\nu$ its Poisson ratio i.e. $$fp = 0.94 \frac{b \cdot c}{W^2}$$ where $c = \sqrt{\frac{E}{\rho}}$ is the speed of compressional sound waves in the material A good rule of thumb is that the gyro resonator frequency, fo, should not exceed fp/2. We always push this near the limit in the interest of best performance for a given die area, so, roughly:

$$fo = 0.4 \frac{b \cdot c}{W^2} \quad (1)$$

One wishes, to get the most mechanical signal possible. This is the displacement, x, of the Coriolis accelerometer for a given input rate, $\Omega$ degrees per second, and is given by:

$$x = \frac{2 \cdot \left(\frac{\Omega \cdot \pi}{180}\right) \cdot v \cdot ka \cdot kb}{(2 \cdot \pi \cdot fo)^2}$$ where v is the resonator velocity and ka, kb are dimensionless design parameters, the ratio of resonator to accelerometer inertias and a frequency enhancement factor, respectively near 0.5 and 2 in our gyros.

But, $v = \frac{F}{D}$ where F is the available force and D is the resonator damping. So, roughly again:

$$x = \frac{\Omega \cdot F}{1200 \cdot fo^2 \cdot D} \quad (2)$$

This highlights another restriction on fo. One wishes it to be as small as possible so that x can be large. However, the lower it becomes, the more susceptable is the gyro to shock and vibration. If it became very low then the gyro might even succumb to sticking. Experienced customers become uneasy at 10kHz while 20kHz is high enough to forget. We usually work around 16kHz. So, in practice, there is little freedom in chosing fo and equation (1) becomes:

$$W = \sqrt{\frac{b \cdot c}{40 \cdot kHz}} \quad \text{(dimensions check OK)} \quad (3)$$
$$\text{(numerical check vs. production designs OK)}$$

The available force from a Tang drive finger array is:

$$F = \frac{\varepsilon \cdot V^2 \cdot b \cdot W \cdot kf}{g \cdot (2 \cdot wf + 2 \cdot g)}$$

where V is the aplied potential, ε is the permittivity of the air, kf is the fringe factor multiplied by the fraction of W used for the drive comb, g is the gap between fingers (drawn at process minimum to maximize F) and wf is the finger width which could, in principle, be g. In practice, kf is close to 1 so that this reduces, roughly, to:

$$F = \frac{\varepsilon \cdot V^2 \cdot b \cdot W}{4 \cdot g^2} \tag{4}$$

The shear damping to the substrate dominates D if both the sacrificial layer and structure are only a few um thick.

If the structure is thicker, the displacement of air by the moving fingers and edges is more significant:

$$D = \frac{\zeta \cdot W^2 \cdot ka}{h} + 4 \cdot \zeta \cdot W \cdot kf \cdot \left(\frac{b}{g}\right)^3 \quad \begin{array}{l} \text{to a first approximation} \\ \text{where } \zeta \text{ is the air viscosity and} \\ \text{h is the sacificial layer thickness} \end{array} \tag{5}$$

Combining equations (2),(4),(5)

$$x = \frac{\Omega \cdot \varepsilon \cdot V^2 \cdot b \cdot h}{\left(2400 \cdot fo^2 \cdot \zeta \cdot W \cdot g^2\right) \cdot \left[1 + 8 \cdot \frac{h}{W} \cdot \left(\frac{b}{g}\right)^3\right]} \quad \begin{array}{l}\text{(dimensions check OK)} \\ \text{(numerical check gen1 OK)}\end{array} \tag{6}$$

The Coriolis accelerometer damping, Da, is dominated by the finger squeeze-film which, also to a first approximation, is:

$$Da = 2 \cdot \zeta \cdot \lambda \cdot N \cdot \left(\frac{b}{g}\right)^3 \quad \text{where N is the number of moving fingers of length } \lambda.$$

In both gen1 and gen2 designs $N = 4 \cdot \frac{W}{p}$ where p is the pitch of the fingers decided by anchor layout rules. The BiMOS rule $p = 12 \cdot g$ will be used for the sake of simplicity, g being the nominal as-manufactured value, 1.25um. The results of the analysis are not very sensitive to this simplification, as will become clear.

The Brownian force per root Hz on the accelerometer is $\sqrt{4 \cdot k \cdot T \cdot Da}$ The Brownian displacement per root Hz, Xb, at fo is, therefore:

$$Xb = \frac{kb \cdot \sqrt{4 \cdot k \cdot T \cdot Da}}{W^2 \cdot b \cdot p \cdot (2 \cdot \pi \cdot fo)^2} \quad \begin{array}{l}\text{where kT is the Boltzman energy, as usual.} \\ \text{So, substituting for Da and N, one obtains:}\end{array}$$

$$Xb = \frac{\sqrt{\frac{k \cdot T \cdot \zeta \cdot \lambda \cdot b}{W^3}}}{12 \cdot p \cdot fo^2 \cdot g^2} \tag{7}$$

The differential signal voltage induced by displacement of the accelerometer is:

$$\frac{2 \cdot \varepsilon \cdot V \cdot x \cdot b \cdot \lambda}{Ct \cdot g^2}$$ where Ct is the effective termination capacitance per finger.

So, if the input-referred voltage noise of the electronics is Vn per root Hz at fo, then the equivalent accelerometer displacement, Xv, is:

$$Xv = \frac{Vn}{V} \cdot \frac{Ct \cdot g^2}{2 \cdot \varepsilon \cdot b \cdot \lambda} \cdot \frac{1}{\sqrt{Hz}} \quad \text{(dimensions check OK)} \tag{8}$$

And the total equivalent displacement noise power is:

$$(Xb^2 + Xv^2) = \left[\frac{k \cdot T \cdot \zeta \cdot \lambda \cdot b}{144 \cdot W^3 \cdot \rho^2 \cdot fo^4 \cdot g^4} + \left(\frac{Vn}{V}\right)^2 \cdot \frac{Ct^2 \cdot g^4}{4 \cdot \varepsilon^2 \cdot b^2 \cdot \lambda^2 \cdot Hz}\right]$$

This can be converted to equivalent rate noise, $\Omega n$, indicative of the gyro performance, by using equation (6) and remembering that the noise folding of the demodulator doubles the effective noise power but not the signal power.

$$\Omega n^2 = 2 \cdot \left[\frac{2400^2 \cdot fo^4 \cdot \zeta^2 \cdot W^2 \cdot g^4}{\varepsilon^2 \cdot V^4 \cdot b^2 \cdot h^2}\left[1 + 8 \cdot \frac{h}{W}\left(\frac{b}{g}\right)^3\right]^2\right]\left[\frac{k \cdot T \cdot \zeta \cdot \lambda \cdot b}{144 \cdot W^3 \cdot \rho^2 \cdot fo^4 \cdot g^4} + \left(\frac{Vn}{V}\right)^2 \cdot \frac{Ct^2 \cdot g^4}{4 \cdot \varepsilon^2 \cdot b^2 \cdot \lambda^2 \cdot Hz}\right]$$

which simplifies to:

$$\Omega n^2 = \left(\frac{8 \cdot 10^4 \cdot \zeta^2}{\varepsilon^2 \cdot V^4 \cdot h^2}\right)\left[1 + 8 \cdot \frac{h}{W}\left(\frac{b}{g}\right)^3\right]^2 \cdot \left[\frac{k \cdot T \cdot \zeta \cdot \lambda}{W \cdot b \cdot \rho^2} + \left(\frac{Vn}{V}\right)^2 \cdot \frac{36 \cdot Ct^2 \cdot g^8 \cdot fo^4 \cdot W^2}{\varepsilon^2 \cdot b^4 \cdot \lambda^2 \cdot Hz}\right]$$

This contains a free parameter, $\lambda$, which would be optimized for minimum $\Omega n$.

$$\frac{d}{d\lambda}\left[\frac{k \cdot T \cdot \zeta \cdot \lambda}{W \cdot b \cdot \rho^2} + \left(\frac{Vn}{V}\right)^2 \cdot \frac{36 \cdot Ct^2 \cdot g^8 \cdot fo^4 \cdot W^2}{\varepsilon^2 \cdot b^4 \cdot \lambda^2 \cdot Hz}\right] = \frac{k \cdot T \cdot \zeta}{W \cdot b \cdot \rho^2} - \left(\frac{Vn}{V}\right)^2 \cdot \frac{72 \cdot Ct^2 \cdot g^8 \cdot fo^4 \cdot W^2}{\varepsilon^2 \cdot b^4 \cdot \lambda^3 \cdot Hz}$$

$$\lambda = \frac{W}{b}\left[\left(\frac{Vn}{V}\right)^2 \cdot \frac{72 \cdot Ct^2 \cdot g^8 \cdot fo^4 \cdot \rho^2}{\varepsilon^2 \cdot k \cdot T \cdot \zeta \cdot Hz}\right]^{\frac{1}{3}} \quad \begin{array}{l}\text{(dimensions check OK)}\\\text{(numerical check gen2 OK)}\end{array} \tag{9}$$

and, substituting back, together with equation (1):

$$\Omega n = \left(\frac{700}{b \cdot h}\right)\left[1 + 8 \cdot h \cdot \sqrt{\frac{fo \cdot 2.5}{b \cdot c}}\left(\frac{b}{g}\right)^3\right]\left(\frac{Ct \cdot Vn \cdot g^4 \cdot fo^2 \cdot \zeta^4 \cdot k \cdot T}{\varepsilon^4 \cdot V^7 \cdot \rho^2 \cdot \sqrt{Hz}}\right)^{\frac{1}{3}} \tag{10}$$

What is claimed is:

1. A method for fabricating a microelectromechanical systems (MEMS) device having a tungsten-based MEMS structure, the method comprising:
   depositing a tungsten-based material using a grain growth inhibitor material to form a tungsten-based material layer at least two microns thick above an underlying oxide layer without first densifying the oxide layer; and
   etching the tungsten-based material layer to form the tungsten-based MEMS structure.

2. A method according to claim 1, wherein the tungsten-based MEMS structure is a releasable tungsten-based movable mass, and wherein the method further comprises removing oxide underlying the releasable tungsten-based movable mass to release the tungsten-based movable mass.

3. A method according to claim 1, wherein the MEMS device includes electronic circuitry prior to depositing the tungsten-based material, and wherein the depositing of the tungsten-based material does not raise the temperature of the electronic circuitry above about 450° C.

4. A method according to claim 1, wherein depositing the tungsten-based material comprises at least one of:
   depositing the tungsten-based material on a target doped with the grain growth inhibitor material; or
   alternately depositing a tungsten-based material layer and introducing the grain growth inhibitor material to stop vertical grain growth to a subsequently deposited tungsten-based material layer.

5. A method according to claim 4, wherein the grain growth inhibitor material includes at least one of:
   boron; or
   a rare-earth metal.

6. A method according to claim 1, wherein etching the tungsten-based material layer comprises:
   etching the tungsten-based material layer using an etchant that is essentially fluorine generated from sulfur hexafluoride ($SF_6$) gas.

7. A method according to claim 1, wherein depositing the tungsten-based material comprises:
   controlling oxygen levels during the deposition of the tungsten-based material.

8. A method according to claim 1, further comprising:
   forming at least one tungsten-based anchor through the oxide layer to an underlying substrate prior to depositing the tungsten-based material to form the tungsten-based material layer, wherein the MEMS structure is anchored to the underlying substrate by the at least one tungsten-based anchor.

9. A method according to claim 8, wherein the at least one tungsten-based anchor is a composite anchor comprising a matrix of tungsten-based anchors around 1 micron in diameter each, and wherein forming the matrix of tungsten-based anchors comprises:
   patterning the oxide layer to form a patterned oxide layer including a matrix of holes of around 1 micron in diameter each through the oxide layer to the underlying substrate; and
   filling the holes with tungsten-based plugs to form the matrix of tungsten-based anchors.

10. A method according to claim 8, wherein the at least one tungsten-based anchor includes a first tungsten-based anchor, and wherein forming the first tungsten-based anchor comprises:
   patterning the oxide layer by etching a cavity in the oxide layer using a plurality of etching steps that incrementally increase a width and depth of the cavity such that the cavity extends through the oxide layer to the underlying substrate and is substantially wider at the top than at the bottom; and
   filling the cavity uniformly with a tungsten-based material to form the first tungsten-based anchor.

11. A method according to claim 8, wherein the underlying substrate is a ground plane structure of the MEMS device, and wherein the at least one tungsten-based anchor is formed of substantially pure tungsten and the ground plane structure is formed of titanium-tungsten.

12. A method according to claim 8, wherein the at least one tungsten-based anchor is filled uniformly without voids or cracks.

13. A method according to claim 8, wherein the at least one tungsten-based anchor and the tungsten-based material layer are formed of the same tungsten-based material.

14. A method according to claim 1, wherein the tungsten-based material is deposited at a temperature under about 500° C.

15. A method according to claim 1, wherein the tungsten-based material is deposited at a temperature between about 400° C. and about 500° C.

16. A method for fabricating a microelectromechanical systems (MEMS) device having a tungsten-based MEMS structure, the method comprising:
   a step for depositing a tungsten-based material using a grain growth inhibitor material to form a tungsten-based material layer at least two microns thick above an underlying oxide layer without first densifying the oxide layer; and
   a step for etching the tungsten-based material layer to form the tungsten-based MEMS structure.

17. A method according to claim 16, wherein the tungsten-based MEMS structure is a releasable tungsten-based movable mass, and wherein the method further comprises a step for releasing the tungsten-based movable mass.

18. A method according to claim 16, wherein the MEMS device includes electronic circuitry prior to depositing the tungsten-based material, and wherein the step for depositing of the tungsten-based material does not raise the temperature of the electronic circuitry above about 450° C.

19. A method according to claim 16, further comprising:
   a step for forming at least one tungsten-based anchor through the oxide layer to an underlying substrate prior to depositing the tungsten-based material to form the tungsten-based material layer, wherein the MEMS structure is anchored to the underlying substrate by the at least one tungsten-based anchor.

* * * * *